US012748131B2

(12) United States Patent
Hsu

(10) Patent No.: US 12,748,131 B2
(45) Date of Patent: Sep. 29, 2026

(54) PROBE ASSEMBLY WITH DOWNWARD-PROTRUDING PROBE SHIELD AND METHODS OF OPERATING THE SAME

(71) Applicant: Taiwan Semiconductor Manufacturing Company Limited, Hsinchu (TW)

(72) Inventor: Ming-Cheng Hsu, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 403 days.

(21) Appl. No.: 18/352,522

(22) Filed: Jul. 14, 2023

(65) Prior Publication Data

US 2025/0020693 A1 Jan. 16, 2025

(51) Int. Cl.
*G01R 1/073* (2006.01)

(52) U.S. Cl.
CPC ..... *G01R 1/07371* (2013.01); *G01R 1/07328* (2013.01)

(58) Field of Classification Search
None
See application file for complete search history.

(56) References Cited

U.S. PATENT DOCUMENTS 5,325,052 A * 6/1994 Yamashita ......... G01R 1/06755 324/750.08
7,049,837 B2 * 5/2006 Kasukabe .......... G01R 1/06744 324/762.05
7,262,615 B2 * 8/2007 Cheng .................. G01R 1/0483 324/762.02
8,603,840 B2 * 12/2013 Matsuhashi .......... G01R 1/0466 324/750.19
9,267,968 B2 * 2/2016 Brandorff .......... G01R 1/07314
(Continued)

FOREIGN PATENT DOCUMENTS

CN 1350325 A 5/2002
TW 201350866 A 12/2013

OTHER PUBLICATIONS

TW Patent and Trademark Office; TW Application No. 112132433; Office Action mailed Jan. 20, 2025; 18 pages.

*Primary Examiner* — Richard Isla
(74) *Attorney, Agent, or Firm* — The Marbury Law Group, PLLC

(57) ABSTRACT

A test apparatus includes a probe assembly, which includes: a multilayer structure including probe contact pads; an upper guide plate including an array of upper holes therethrough; a lower guide plate including an array of lower holes therethrough; a dielectric spacer plate located between the upper guide plate and the lower guide plate and including an opening; and an array of probes attached to the probe contact pads, vertically extending through the upper guide plate, the lower guide plate, and the dielectric spacer plate. The lower guide plate includes a downward-protruding portion having a first laterally-extending segment having a first width, and further includes a base portion overlying the downward-protruding portion and having a wider second width. The downward-protruding portion can be used to protect the array of probes while probing test pads on a wafer that are exposed between neighboring semiconductor dies.

20 Claims, 22 Drawing Sheets

(56) References Cited

U.S. PATENT DOCUMENTS

| | | | | |
|---|---|---|---|---|
| 10,782,319 | B2 * | 9/2020 | Crippa | G01R 31/2887 |
| 10,996,243 | B2 * | 5/2021 | Iwana | G01R 1/07357 |
| 2005/0019965 | A1 * | 1/2005 | Chao | H01L 22/32 438/460 |
| 2008/0180123 | A1 | 7/2008 | Cheng et al. | |
| 2013/0069683 | A1 | 3/2013 | Kuo et al. | |

* cited by examiner

PROBE ASSEMBLY WITH DOWNWARD-PROTRUDING PROBE SHIELD AND METHODS OF OPERATING THE SAME

BACKGROUND

A probe card may be built and used in a test apparatus to enable testing of semiconductor dies once the electrical layout of an array of test pads in the semiconductor dies is known. High density metal pads in semiconductor dies utilize a probe card with a fine pitch and a high pin count. Parallel testing may be used to cope with the complexity of semiconductor-on-chip (SoC) devices and to probe more than one device at a time, thereby enhance the test output of the test apparatus. Often, tester throughput is a limiting factor in semiconductor fabrication capacity. Thus, improvements in probe cards are desired to increase the throughput in testing with probe cards.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
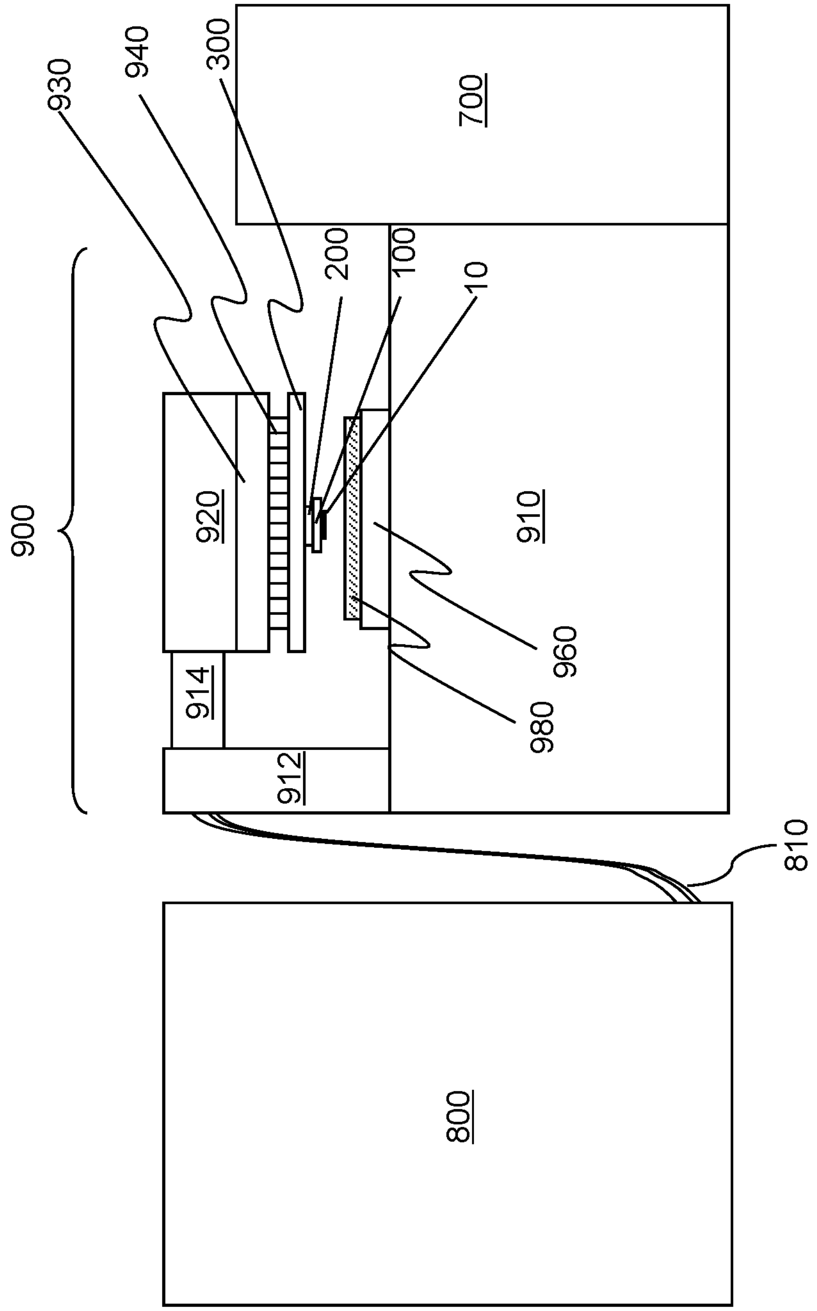
FIG. 1 is a schematic view of a test apparatus according to an embodiment of the present disclosure.
Figure 2A:
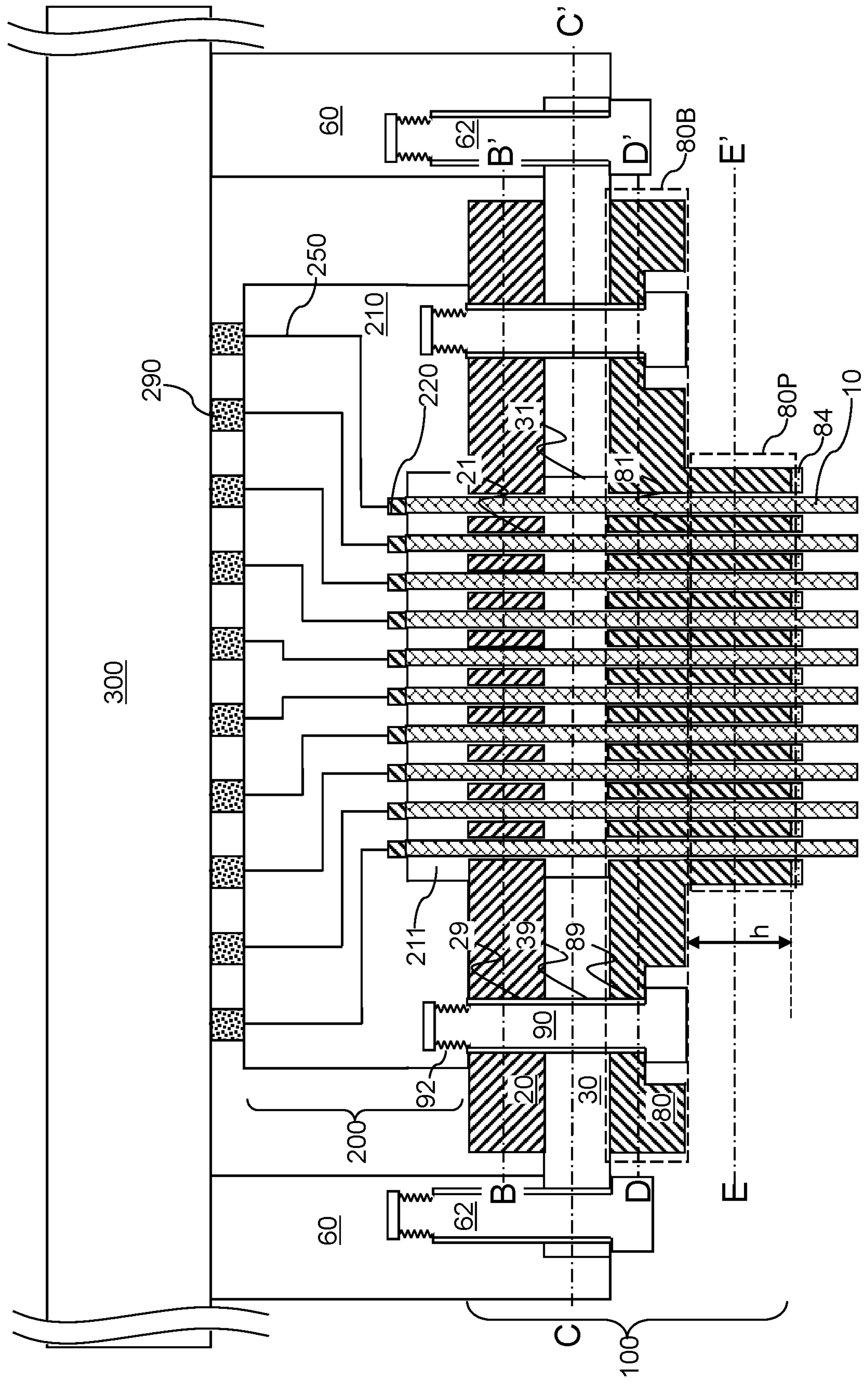
FIG. 2A is a vertical cross-sectional view of an exemplary probe assembly according to an embodiment of the present disclosure.
Figure 2B:
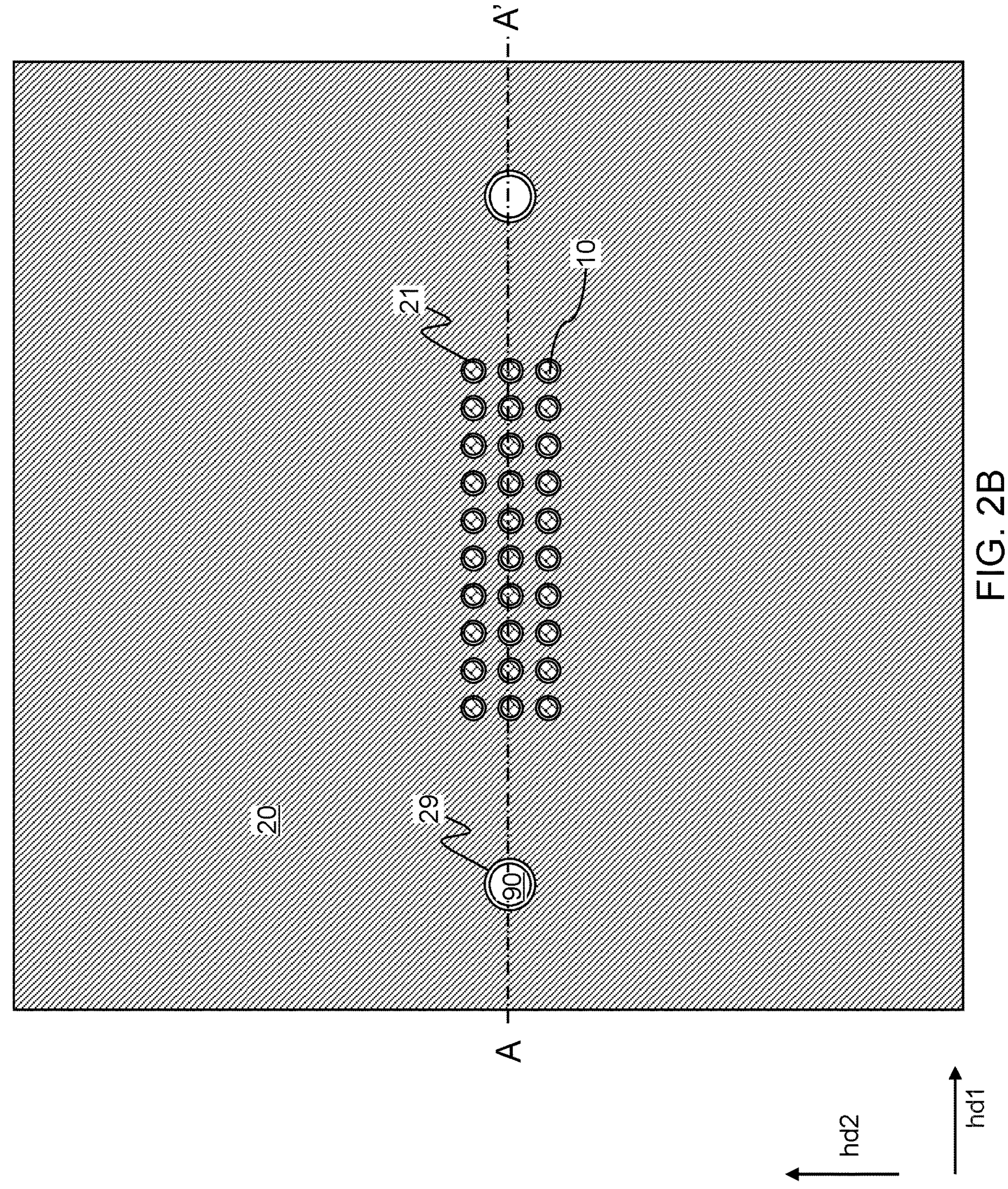
FIG. 2B is a horizontal cross-sectional view along the horizontal plane B-B' of the exemplary probe assembly of FIG. 2A.
Figure 2C:
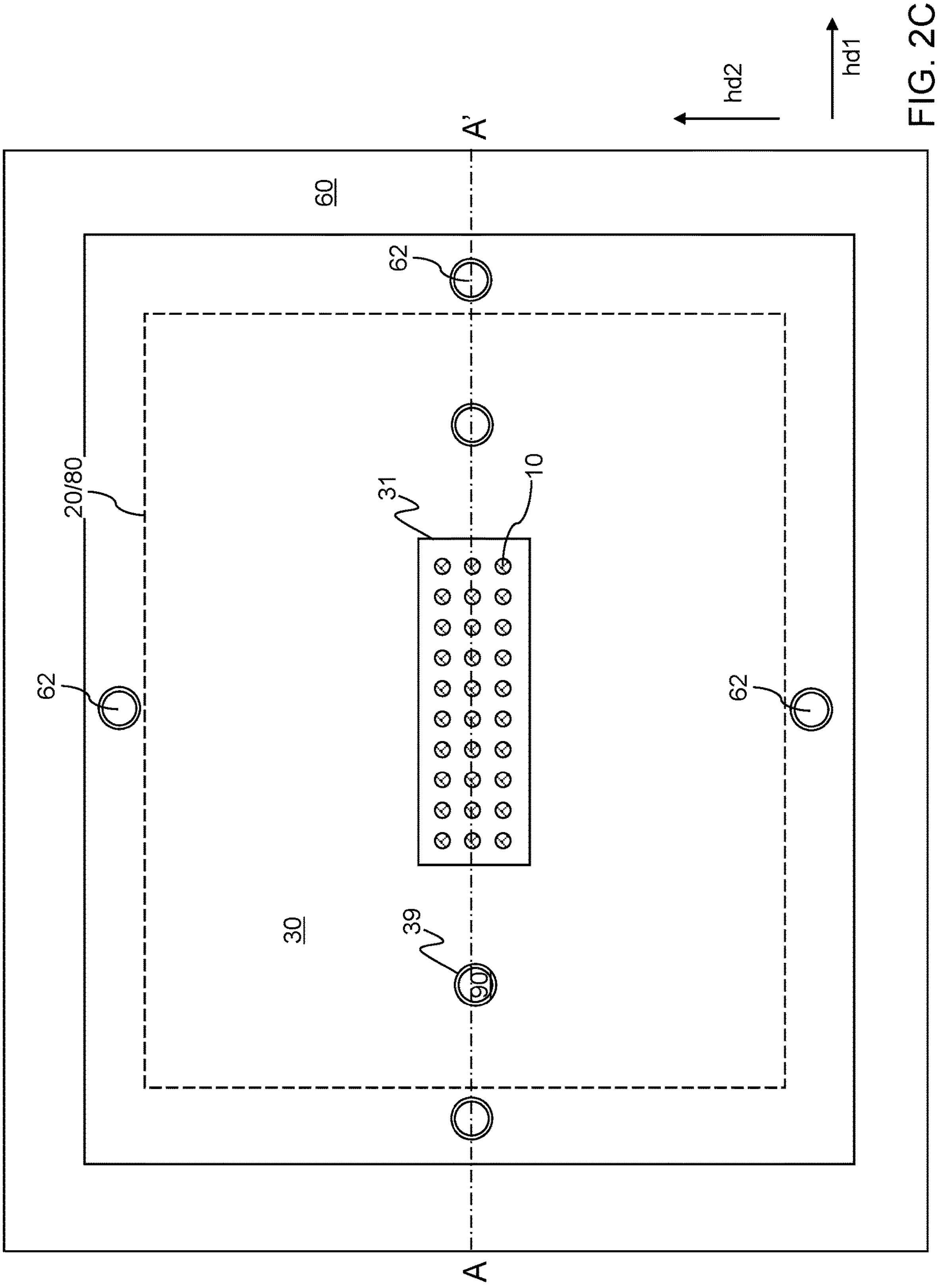
FIG. 2C is a horizontal cross-sectional view along the horizontal plane C-C' of the exemplary probe assembly of FIG. 2A.
Figure 2D:
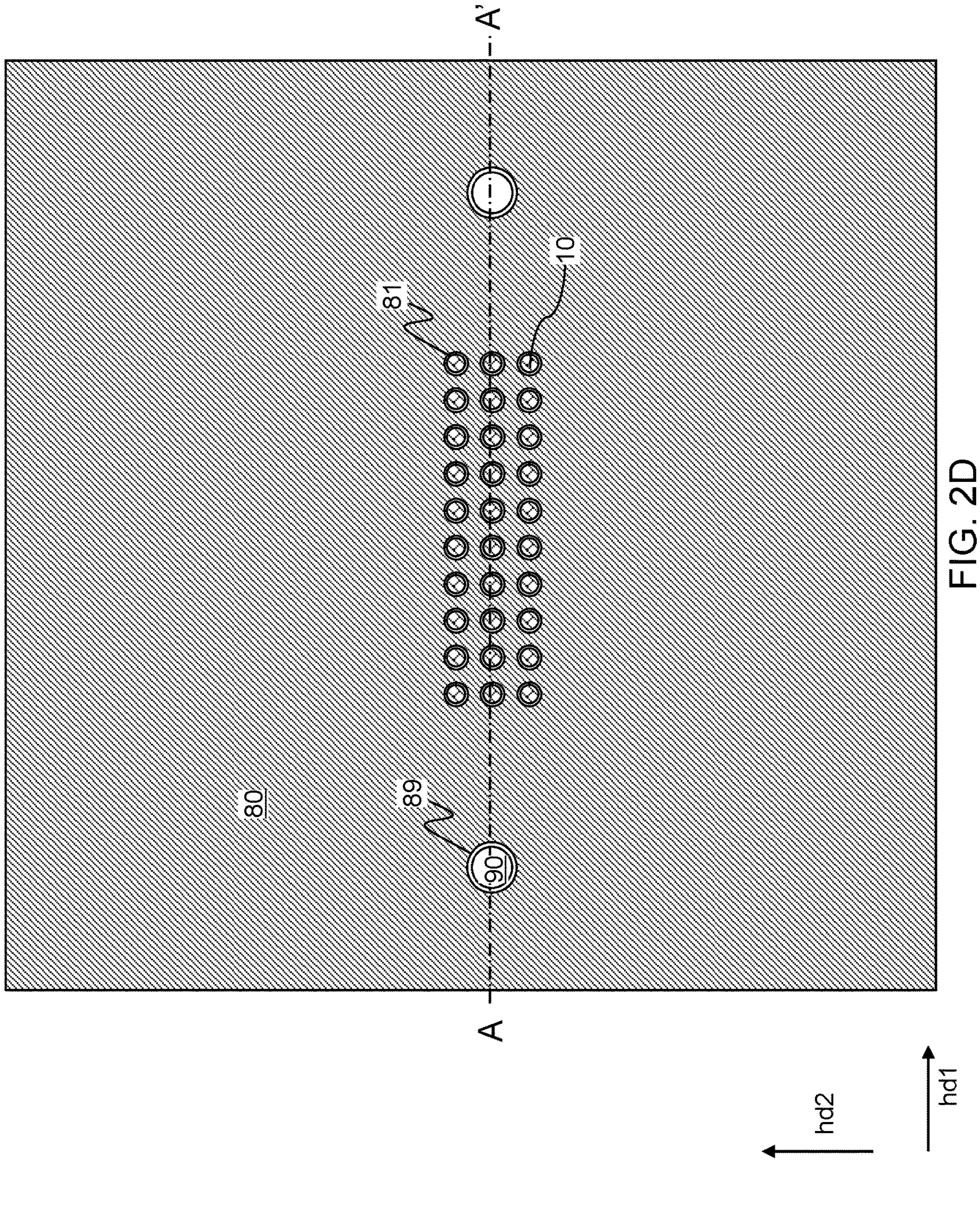
FIG. 2D is a horizontal cross-sectional view along the horizontal plane D-D' of the exemplary probe assembly of FIG. 2A.
Figure 2E:
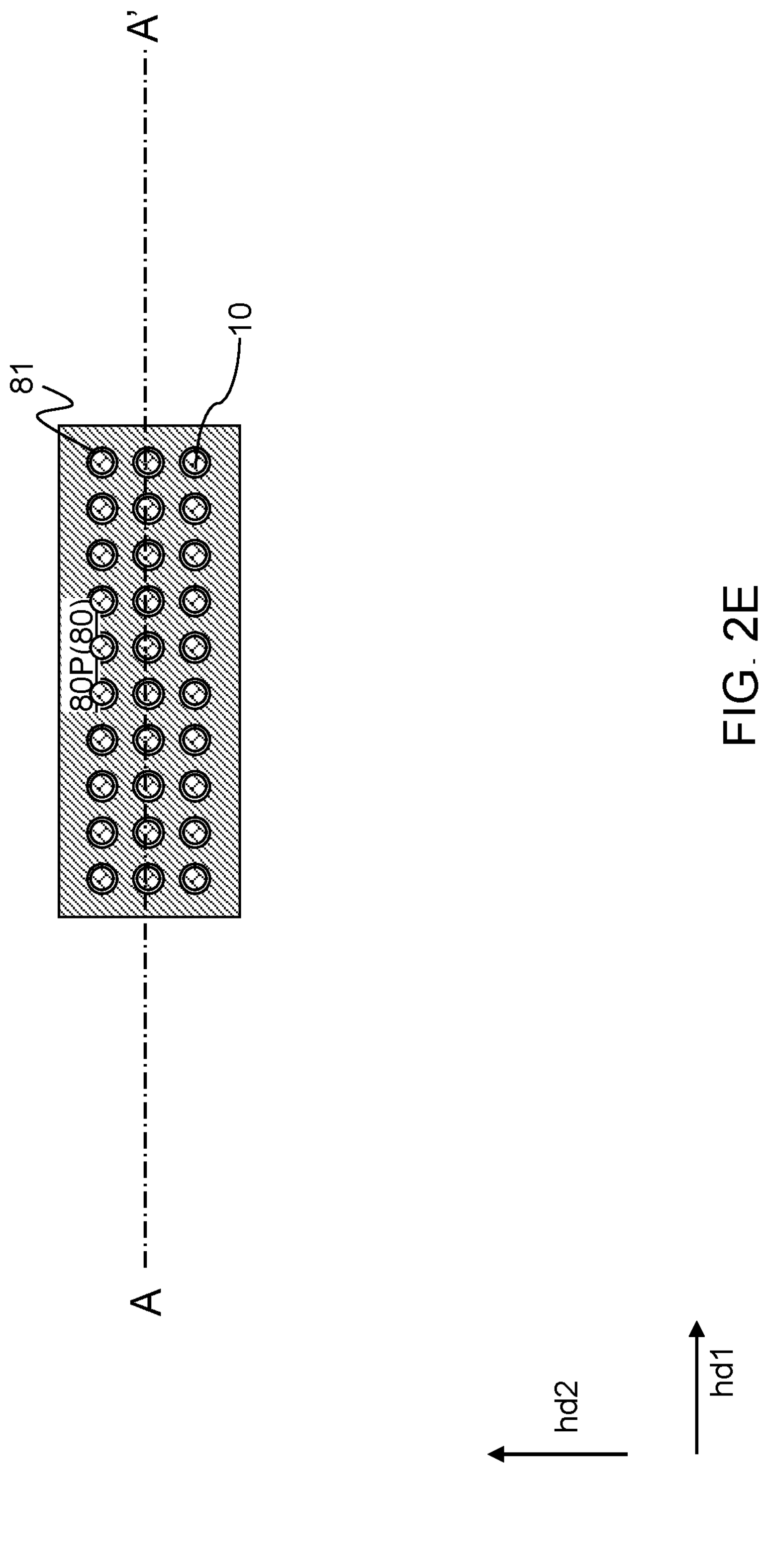
FIG. 2E is a horizontal cross-sectional view along the horizontal plane E-E' of the exemplary probe assembly of FIG. 2A.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. Elements with the same reference numerals are presumed to be the same or similar, and are presumed to have the same material composition and the same functionality unless expressly indicated otherwise.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Elements with the same reference numerals refer to the same element, and are presumed to have the same material composition and the same thickness range unless expressly indicated otherwise.

A test apparatus may include a tester head, a probe card attached to the tester head, and a probe assembly attached to the probe card. The probe assembly may include probes that may be attached to probe contact pads within a multilayer structure including redistribution structures. The probes may be spatially and structurally stabilized by providing guide plates. The guide plates may include an upper guide plate that is proximal to the multilayer structure, and a lower guide plate that is distal from the multilayer structure. A dielectric spacer plate may be used to provide vertical spacing between the upper guide plate and the lower guide plate. During assembly of the upper guide plate, the lower guide plate, and the dielectric spacer plate, the probes may be inserted through arrays of holes in the guide plates and through an opening in the dielectric spacer plate. An automated probe insertion process is typically used to automate the insertion of the probes through the guide plates and the dielectric spacer plate. The throughput of the automated probe insertion process is generally proportional to the thickness of the dielectric spacer plate. In other words, the thicker the dielectric spacer plate, the more time it takes for the automated probe insertion process to successfully insert an array of probes through an assembly of an upper guide plate, a lower guide plate, and a dielectric spacer plate.

A minimum vertical distance between the upper guide plate and the lower guide plate may be used to provide sufficient structural stability in the probe assembly. The minimum vertical distance is typically in a range from 3 mm to 6 mm, such as about 4 nm. According to an aspect of the present disclosure, a plurality of dielectric spacer plates may be used in lieu of the a single dielectric spacer plate. One of the dielectric spacer plate may be positioned between the upper guide plate and the lower guide plate during the automated probe insertion process. At least another of the dielectric spacer plate may be inserted from the side after the automated probe insertion process to provide sufficient vertical spacing between the upper guide plate and the lower guide plate. Since the thickness of the dielectric spacer plate through which the probes are inserted is less than the final vertical spacing between the upper guide plate and the lower guide plate, the automated probe insertion process takes less time due to reduction of the thickness of the dielectric spacer plate that is present at the time of the insertion of the probes therethrough. At the same time, the final vertical spacing between the upper guide plate and the lower guide plate may be maintained at the same level, and thus, performance and the structural stability of the probe assembly are not affected. The various aspects of embodiments of the present disclosure are described in detail here below with reference to accompanying drawings.

Referring to FIG. 1, an embodiment test apparatus illustrating an aspect of the present disclosure is provided. The embodiment test apparatus may include a tester electronics unit 800 including at least one computer and peripheral devices, a wafer prober 900 in communication with the tester electronics unit 800, for example, via signal and power cables 810, and an optional wafer conveyer unit 700 configured to load and unload a unit under testing (UUT) 980 to be tested on the wafer prober 900. The wafer prober 900 may include a wafer chuck 960 configured to hold a unit under testing (UUT) 980 thereupon, a prober frame 910 containing a stage drive unit configured to laterally drive the wafer chuck 960, a tester head 920 that overlies the wafer chuck 960, and tester head support structures (912, 914) configured to structurally support, and to provide movement to, the tester head 920.

A performance board 930 may be attached to the bottom of the tester head 920, and a probe card 300 may be attached to the bottom end of the performance board 930 using a suitable array of contact structures 940 such as an array of spring-type contact pins. The probe card 300 may comprise a printed circuit board (PCB) containing a plastic substrate and printed circuits thereupon. A stiffener (not illustrated) may be attached to the backside of the probe card 300 to reduce structural deformation of the probe card 300 due to thermal and/or mechanical stress during use of the probe card 300. The probe card 300 may also be referred to as a main board.

A probe assembly (10, 100, 200, 60) may be attached to the bottom of the probe card 300. The probe assembly (10, 100, 200, 60) comprises a multilayer structure 200, a plate assembly 100 including an upper guide plate, a lower guide plate, and a plurality dielectric spacer plates, and an array of probes 10. The probe assembly (10, 100, 200, 60) may include various elements of the present disclosure. Specifically, the plate assembly 100 may be assembled in a manner that expedites the automated probe insertion process according to an embodiment of the present disclosure. Further, the plate assembly 100 may have structural characteristics that provide for an acceleration of the automated probe insertion process according to an embodiment of the present disclosure.

Referring to FIGS. 2A-2E, a region around a probe assembly (10, 100, 200, 60) according to an embodiment of the present disclosure is illustrated, which may be incorporated into the embodiment test apparatus of FIG. 1. The multilayer structure 200 may include an array of probe contact pads 220 having a same two-dimensional periodicity as an array of probes 10. The array of probes 10 may be attached to the array of probe contact pads 220 using methods known in the art. For example, the array of probes 10 may be attached to the array of probe contact pads 220 via solder material portions, metal-to-metal bonding, conductive paste portions, and/or epoxy.

The probes 10 are thin and sharp, and may be made of a durable conductive material such as tungsten or gold. The probes 10 may be arranged in a pattern that matches the pattern of the test pads on a wafer to be subsequently used. The probes 10 make physical contact with the test pads on the wafer, and are electrically conductive so that electrical signals may be transmitted into, and out of, the test pads on the wafer to be subsequently tested.

The total number of probes 10 within the array of probes 10 is typically in a range from 10 to 100,000, such as from 100 to 10,000 although lesser and greater number of probes 10 may also be used. The pitch of the probes 10 (i.e., center-to-center distance between neighboring pairs of probes 10) may be the same as the pitch of the test access points (such as test pads) on the unit under testing (UUT). In instances in which the unit under testing comprises an assembly of a wafer and semiconductor dies, and in instances in which the test access points comprise test pads that are positioned between neighboring pairs of semiconductor dies, the pitch of the probes 10 may be the same as the pitch of a subset of the test pads to be used as the access points.

The access points on the wafer may be electrically connected to a respective one of the semiconductor dies through interconnect structures (such as redistribution interconnect structures) in the wafer, and the semiconductor die that is electrically connected to the access points contacted by the array of probes 10 may be tested for functionality. In an illustrative example, the pitch of the probes 10 may be in a range from 10 microns to 100 microns, although lesser and greater pitches may also be used. While the present disclosure is described using an embodiment in which the probes 10 are arranged as a 3×10 rectangular array, embodiments are expressly contemplated herein in which the probes 10 are arranged in an array configuration of a different size and/or in a non-rectangular array.

The multilayer structure 200 may include a multilayer dielectric matrix 210 and redistribution structures 250 embedded in the multilayer dielectric matrix 210. The multilayer dielectric matrix 210 may include ceramic layers or organic layers. In embodiments in which the multilayer dielectric matrix 210 includes ceramic layers, the multilayer structure 200 may be referred to as multilayer ceramic structure. In embodiments in which the multilayer dielectric matrix 210 include organic layers, the multilayer structure 200 may be referred to as multilayer organic structure. A subset of the redistribution structure 250 may include an array of contact structures on a side that faces the probe card 300. The array of contact structures may have a greater pitch than the pitch of the probes 10. The multilayer structure 200 may be attached to the probe card 300 through an array of interconnection structures 290, which may include an array of solder balls or may include an interposer including an array of vertical interconnection structures.

In one embodiment, the array of probes 10 may be attached to the array of probe contact pads 220 within a recess region 211 in which a horizontal surface of the multilayer structure 200 is recessed toward the probe card 300 (i.e., recessed upward) relative to a horizontal frame surface of the multilayer structure 200 that laterally surrounds the recess region.

The plate assembly 100 may include an upper guide plate 20 which may include an upper array of upper holes 21 therethrough, a lower guide plate 80 may include a lower array of lower holes 81 therethrough, and a dielectric spacer plate 30 located between the upper guide plate 20 and the lower guide plate 80 and comprising a respective opening 31 therethrough. The upper guide plate 20 may be more proximal to the multilayer structure 200 than the lower guide plate 80 is to the multilayer structure 200. In one embodiment, the upper guide plate 20 may contact a bottom surface (such as the horizontal frame surface of the multilayer structure 200. The lower guide plate 80 may be vertically spaced from the upper guide plate 20 by the vertical stack of the plurality of dielectric spacer plates 30.

The array of probes 10 may be attached to the probe contact pads 220, and may vertically extend through the array of upper holes 21 and the array of lower holes 81, and may vertically extend through the opening 31 through the vertical stack of the plurality of dielectric spacer plates 30. The multilayer structure 200 may include the redistribution structures 250 and the multilayer dielectric matrix 210, which surrounds and embeds the redistribution structures 250. The probe contact pads 220 may be connected to a respective one of the redistribution structures 250.

In one embodiment, the dielectric spacer plate 30 may comprise at least two guide openings 39 therethrough, and the probe assembly (10, 100, 200, 60) comprises at least two guide posts 90 vertically extending through the guide opening 39 within the dielectric spacer plate 30. In one embodiment, the upper guide plate 20 comprises at least two upper guide openings 29 therethrough, and the lower guide plate 80 comprises at least two lower guide openings 89 therethrough. In one embodiment, each of the at least two guide posts 90 may vertically extend through a respective one of the upper guide openings 29 and through a respective one of the lower guide openings 89. In one embodiment, each of the at least two guide posts 90 may vertically extend through a respective one of the upper guide openings 29 and through a respective one of the lower guide openings 89 and through a respective guide opening 39 within the dielectric spacer plate 30 selected from the plurality of dielectric spacer plates 30.

In one embodiment, each of the at least two guide posts 90 may include a respective fixture element at a top end, i.e., an end that is proximal to the multilayer structure 200. For example, a fixture element 92 such as a thread of a bolt may be used to enable mechanically fixing the top end of each of the at least two guide posts 90 onto, and/or into, the multilayer structure 200. In this embodiment, the multilayer structure 200 may include at least two mating fixture elements configured to mate with the fixture elements 92 of the at least two guide posts 90. For example, the multilayer structure 200 may include two or more threaded holes configured to accommodate, and form a stable mechanical support for, a thread of a bolt which may form a respective guide post 90. In an illustrative example, the at least two guide posts 90 may include at least two threaded bolts or at least two screws.

In one embodiment, the dielectric spacer plate 30 may include an outer periphery and an inner periphery that is laterally surrounded by, and is spaced from, the outer periphery. The dielectric spacer plate 30 laterally surrounds each probe 10 selected from the array of probes 10. In one embodiment, the dielectric spacer plate 30 may include at least one opening, of which each periphery is an inner periphery of the dielectric spacer plate 30. In one embodiment, the at least one opening of the dielectric spacer plate 30 may have a rectangular shape, a shape of a rounded rectangle, an L-shaped area, a U-shaped area, a plurality of elongated rectangles that are parallel to one another, or a shape of a frame. Generally, the at least one opening in the dielectric spacer plate 30 may be a shape that envelops all areas of the array of probes 10, and depends on the general arrangement of the array of probes 10. In one embodiment, the outer periphery of the dielectric spacer plate 30 may have a rectangular shape of a shape of a rounded rectangle.

The thickness of the upper guide plate 20 may be in a range from 1 mm to 4 mm, such as from 1.5 mm to 2.5 mm, although lesser and greater thicknesses may also be used. The thickness of the lower guide plate 80 may be in a range from 1 mm to 4 mm, such as from 1.5 mm to 2.5 mm, although lesser and greater thicknesses may also be used. The thickness of dielectric spacer plate 30 may be in a range from 1 mm to 6 mm, such as from 2 mm to 5 mm, although lesser and total thicknesses may also be used. As noted above, the thickness of the upper guide plate 20, lower guide plate 80 and dielectric spacer plate 30 provide stability for the probe card and array of probes 10, while easing and expediting the automated probe insertion process.

Generally, the probe assembly (10, 100, 200, 60) of the present disclosure may comprise a multilayer structure 200 comprising probe contact pads 220; an upper guide plate 20 comprising an array of upper holes 21 therethrough; a lower guide plate 80 comprising an array of lower holes 81 therethrough; a dielectric spacer plate 30 located between the upper guide plate 20 and the lower guide plate 80 and comprising an opening 31; and an array of probes 10 attached to the probe contact pads 220, vertically extending through the array of upper holes 21 and the array of lower holes 81, and vertically extending through the opening 31 through the dielectric spacer plate 30. According to an aspect of the present disclosure, the lower guide plate 80 comprises a downward-protruding portion 80P having a first laterally-extending segment having a first width, and further comprises a base portion 80B overlying the downward-protruding portion 80P and having a second width that is larger than the first width. The first width may be in a range from 50 microns to 2 mm, such as from 100 microns to 1 mm, and/or from 200 microns to 500 microns, although lesser and greater dimensions may also be used. In one embodiment, the second width is at least 5 times the first width. The height h of the downward-protruding portion 80P may be the same as or significantly the same as the thickness of semiconductor dies to be subsequently attached to a wafer, and may be greater than 150 microns, and/or 200 microns, and/or greater than 300 microns, and/or greater than 500 microns, and/or greater than 700 microns, and/or greater than 1 mm, and/or greater than 2 mm, and/or greater than 3 mm, and/or greater than 5 mm.

In one embodiment, the downward-protruding portion 80P may be elongated along a horizontal direction that is perpendicular to a widthwise direction of the downward-protruding portion 80P. In one embodiment, the downward-protruding portion 80P may be elongated along a first horizontal direction hd1, and may have the first width along a second horizontal direction hd2 that is perpendicular to the first horizontal direction hd1. In one embodiment, the downward-protruding portion 80P may comprise a first laterally-extending segment having a first length along the first horizontal direction hd1. The first length may be at least 5 times the first width. In one embodiment, the downward-protruding portion 80P of the lower guide plate 80 comprises a first laterally-extending segment that is configured to be positioned in a gap between a neighboring pair of semiconductor dies such that the first laterally-extending segment is located below a horizontal plane including top surfaces of the semiconductor dies.

The base portion 80B of the lower guide plate 80 may be wider than the gap between neighboring pairs of semiconductor dies to be used for testing. The base portion 80B of the lower guide plate 80 may be configured to overlie the neighboring pair of semiconductor dies during testing. The lateral extent of the base portion 80B may be greater than 5 times the first width of the downward-protruding portion 80P, and may be greater than 10 times, and/or 20 times, and/or 50 times, and/or 100 times, the first width of the downward-protruding portion 80P. Generally, the downward-protruding portion 80P laterally extends along the first horizontal direction hd1 by a greater distance than a width of the gap between neighboring pairs of semiconductor dies to be subsequently used during testing.

In one embodiment, a dielectric polymer layer 84 may be located on a bottom surface of the downward-protruding portion 80P. The dielectric polymer layer 84 may have an array of openings through which the array of probes 10 vertically extends. In one embodiment, the dielectric polymer layer 84 may have the same horizontal cross-sectional shape as the downward-protruding portion 80P of the lower guide plate 80. In one embodiment, the dielectric polymer layer 84 may have a width that is less than a lateral dimension of the gap between neighboring pairs of semiconductor dies to be subsequently used during testing.

Generally, the downward-protruding portion 80P of the lower guide plate 80 may have a horizontal cross-sectional shape that does not overlap with any of semiconductor dies that overlie a wafer during testing that is performed on a bonded assembly of the wafer and the semiconductor dies. In one embodiment, the downward-protruding portion 80P of the lower guide plate 80 may be configured to fit a single gap between a first semiconductor die and a second semiconductor die that is a neighboring die of the first semiconductor die, or may be configured to fit a plurality of gaps that may, or may not, be interconnected to one another and/or may laterally extend along a same horizontal direction over the bonded assembly. Further, while an embodiment in which the lower guide plate 80 comprises a single downward-protruding portion 80P is described herein, embodiments are expressly contemplated herein in which the lower guide plate 80 comprises a plurality of downward-protruding portions 80P.

Optionally, the probe assembly (10, 100, 200, 60) of the present disclosure may comprise a jig 60 that laterally surrounds the a multilayer structure 200, the upper guide plate 20, and the dielectric spacer plate 80. The jig 60, if present, is configured to be mounted to a bottom surface of the probe card 300. In one embodiment, the dielectric spacer plate 80 may have a greater lateral extent than the upper guide plate 20 and the lower guide plate 80, and may have a recessed inner bottom surface that is configured to contact a laterally-protruding peripheral portion of the top surface of the dielectric spacer plate 80 that protrudes outward from sidewalls of the upper guide plate 20. The dielectric spacer plate 80 may be affixed to the jig 60 employing fastener elements 92, which may comprise mechanical elements such as bolts, nuts, screws, clips, rivets, pins, etc. If present, the jig 60 may be used to hold and position the plate assembly 100 during testing. For example, the jig 60 may be used to stabilize the position of the plate assembly 100, and to provide consistent contact with the device under testing. In some embodiments, the jig may be used to control the pressure that the array of probes 10 apply to the device under testing to provide consistent and repeatable testing of the device under testing.

Figure 3A:
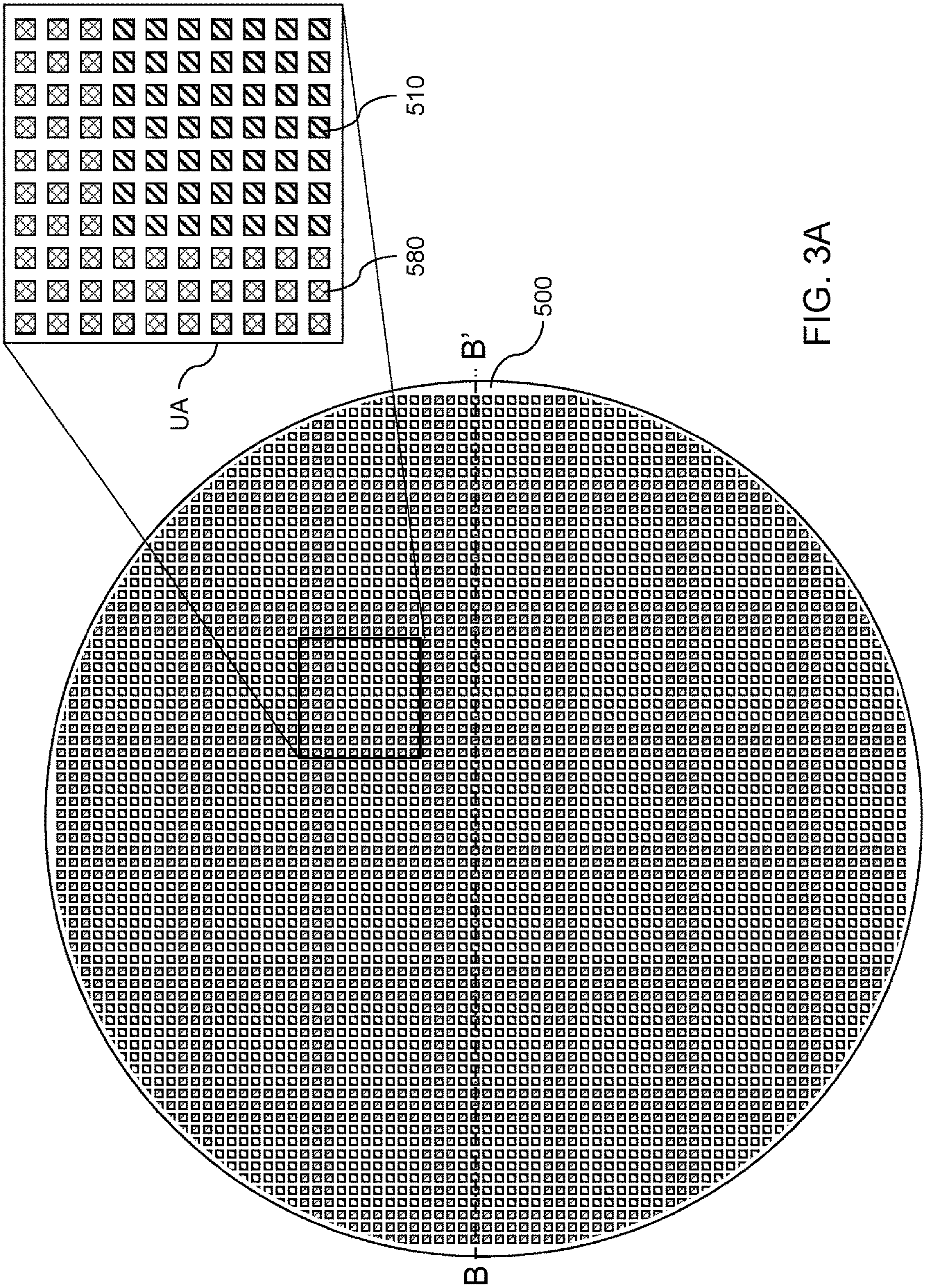
FIG. 3A is plan view of a wafer after formation of wafer-side bonding pads and test pads according to an embodiment of the present disclosure.
Figure 3B:
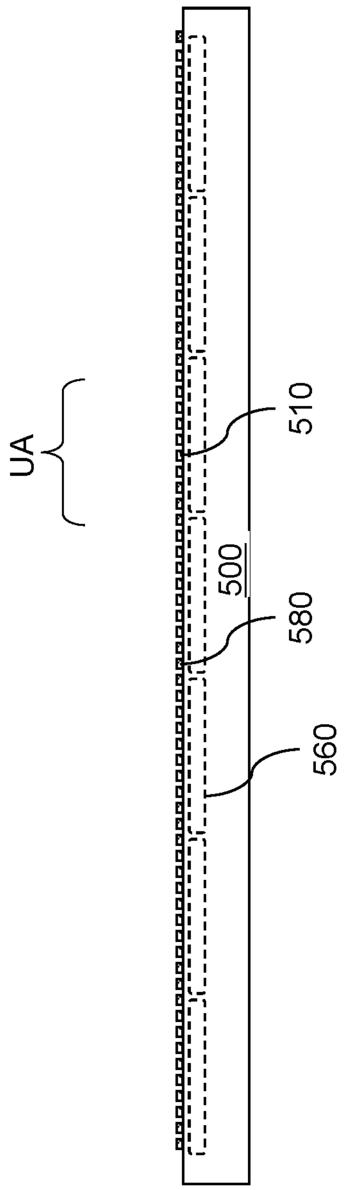
FIG. 3B is a vertical cross-sectional view of the wafer along the vertical plane B-B' of FIG. 3A.

Referring to FIGS. 3A and 3B, a wafer 500 is illustrated after formation of wafer-side bonding pads 510 and test pads 580 thereupon. In one embodiment, the wafer 500 may comprise a substrate and an array of interposers that is formed above the substrate. The substrate may be any suitable substrate on which the array of interposers can be formed. In one embodiment, each of the interposers may comprise redistribution interconnect structures 560 embedded within redistribution dielectric layers. The wafer-side bonding pads 510 and the test pads 580 may be formed over the redistribution interconnect structures 560, for example, by depositing and patterning at least one electrically conductive material (such as copper). In this embodiment, the wafer-side bonding pads 510 and the test pads 580 may have the same material composition and the same thickness.

In one embodiment, a pattern including a set of wafer-side bonding pads 510 and a set of test pads 580 may be repeated in a periodic or non-periodic two-dimensional array over the wafer 500. The area of the pattern is herein referred to as a unit area UA. Each set of wafer-side bonding pads 510 may be used to subsequently bond a semiconductor die. Within each unit area UA, a set of redistribution interconnect structures 560 may provide electrical connection between a set of wafer-side bonding pads 510 and a set of test pads 580.

Figure 4A:
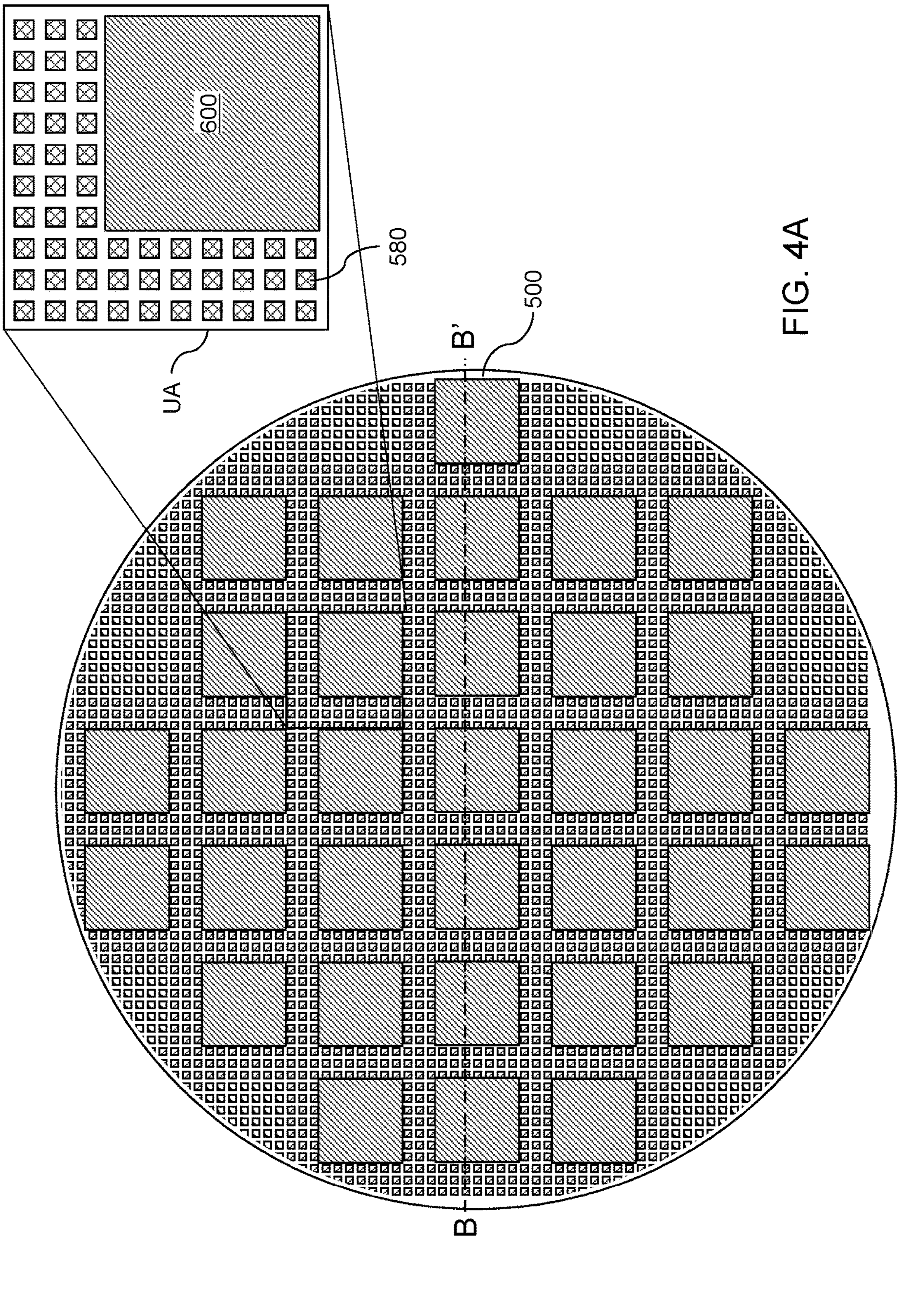
FIG. 4A is a plan view of an assembly of the wafer and semiconductor dies according to an embodiment of the present disclosure.
Figure 4B:
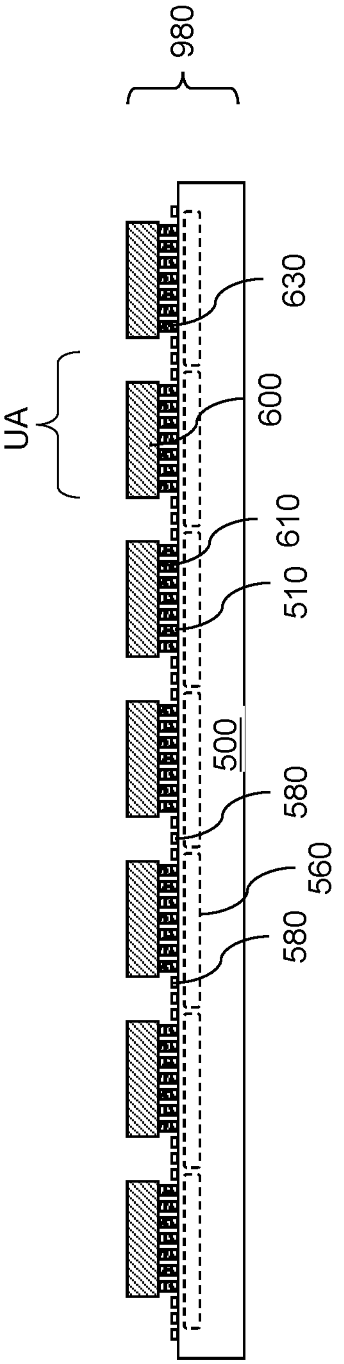
FIG. 4B is a vertical cross-sectional view of the assembly along the vertical plane B-B' of FIG. 4A.
Figure 4C:
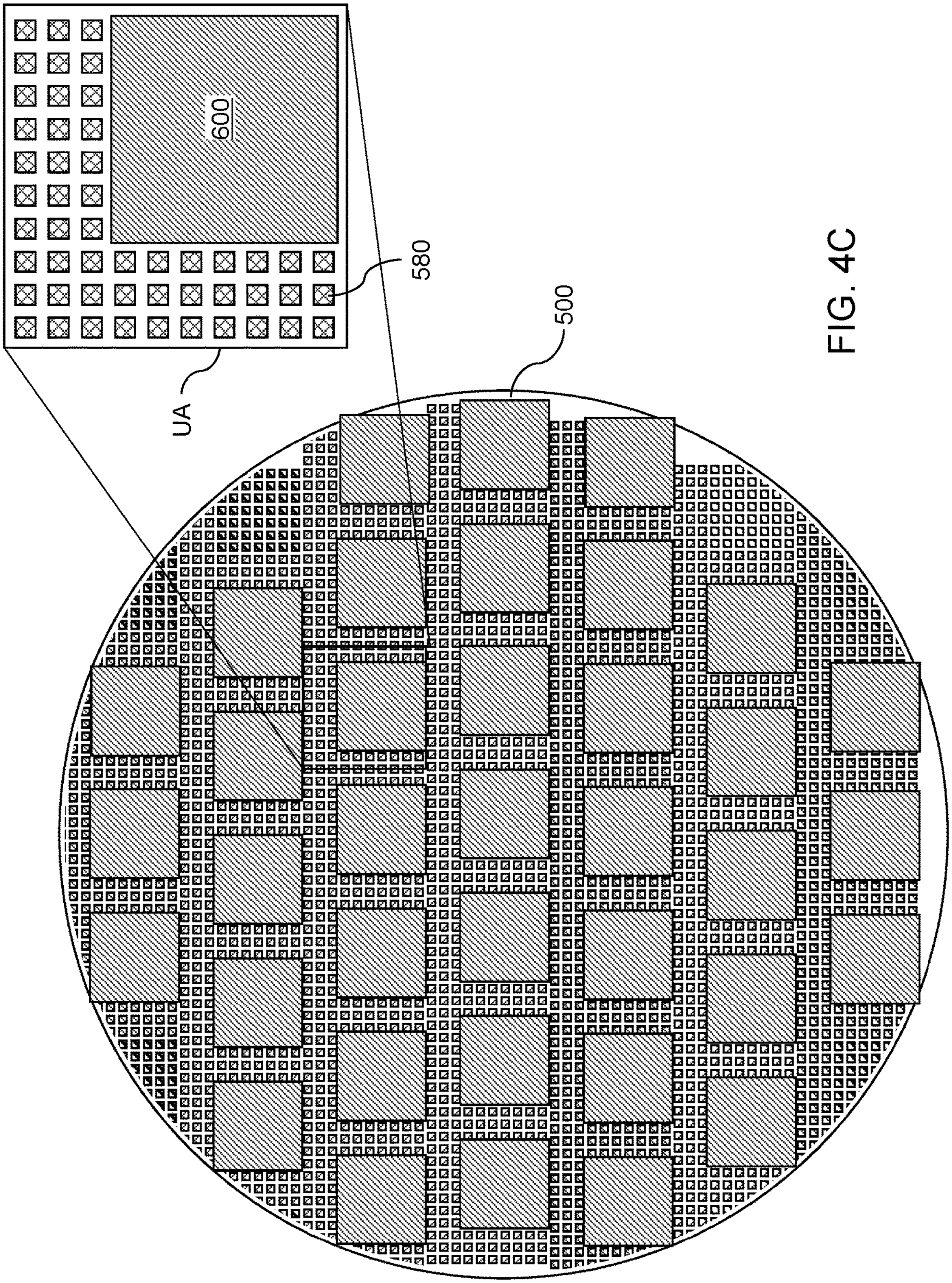
FIG. 4C is a plan view of an alternative configuration of the assembly of the wafer and semiconductor dies according to an embodiment of the present disclosure.

Referring to FIGS. 4A and 4B, an assembly of the wafer 500 and semiconductor dies 600 may be formed by attaching the semiconductor dies 600 to the wafer. The embodiment illustrated in FIGS. 4A and 4B corresponds to a case in which the interposers within the wafer 500 are arranged as a periodic two-dimensional array having a first periodicity along a first horizontal direction in the wafer 500 and having a second periodicity along a second horizontal direction in the wafer 500. In this embodiment, the attached semiconductor dies 600 can be arranged as a periodic two-dimensional array. Generally, the arrangement of the semiconductor dies 600 over the wafer 500 may, or may not, have a two-dimensional periodicity. FIG. 4C illustrates an embodiment in which the interposers in the wafer 500 and the semiconductor dies 600 attached to the wafer 500 are not arranged as a periodic two-dimensional array.

Referring collectively to FIGS. 4A-4C, each semiconductor die 600 may comprise die-side bonding pads 610 that are arranged in a mirror pattern of the pattern of a set of wafer-side bonding pads 510. An array of solder material portions 630 can be formed on the wafer-side bonding pads 510 or on the die-side bonding pads 630, and solder bonding can be performed to attach each semiconductor die 600 to the wafer 500.

Generally, an assembly of a wafer 500 and semiconductor dies 600 may be formed, in which the semiconductor dies 600 are attached to the wafer 500. The semiconductor dies 600 can be attached to the wafer 500 by solder bonding using solder material portions 630, or can be attached to the wafer 500 by metal-to-metal bonding in which the wafer-side bonding pads 510 are directly bonded to the die-side bonding pads 610. The wafer 500 comprises test pads 580 located underneath gaps between the semiconductor dies 600. Further, the wafer 500 comprises interconnect structures, such as redistribution interconnect structures 560, providing electrically conductive paths between the test pads 580 and the semiconductor dies 600. Generally, a set of redistribution interconnect structures 560 can be located within a respective interposer, and can provide electrically conductive paths between an overlying set of wafer-side bonding pads 510 and an adjacent set of test pads 580.

In one embodiment, the wafer 500 comprises a plurality of interposers. The interposers comprise interconnect structures providing electrically conductive paths between the test pads 580 and a respective one of the semiconductor dies 600. In one embodiment, the interconnect structures comprise redistribution interconnect structures 560 embedded within redistribution dielectric layers that are located in an upper portion of the wafer 500. In one embodiment, the wafer 500 comprise wafer-side bonding pads 510. The semiconductor dies 600 comprise die-side bonding pads 610 that are bonded to a respective subset of the wafer-side bonding pads 510. The wafer 500 comprises test pads 580 located underneath gaps between neighboring pairs of semiconductor dies 600.

In one embodiment, the semiconductor dies 600 comprise die-side bonding pads 610 that are bonded to a respective subset of the wafer-side bonding pads 510 through a respective set of solder material portions 630. In one embodiment, the wafer-side bonding pads 510 can have the same material composition as the test pads 580, and can have a same thickness as the test pads 580. In one embodiment, the wafer-side bonding pads 510 and the test pads 580 may have a respective upper portion comprising, and/or consisting essentially of, copper. Upon bonding of semiconductor dies 600 to the wafer 500, the redistribution interconnect structures 560 can provide electrically conductive paths between devices inside the semiconductor dies 600 and the test pads 580. The assembly of the wafer 500 and the array of semiconductor dies 600 can be used as the unit under testing (UUT) 980 illustrated in FIG. 1.

Figure 5:
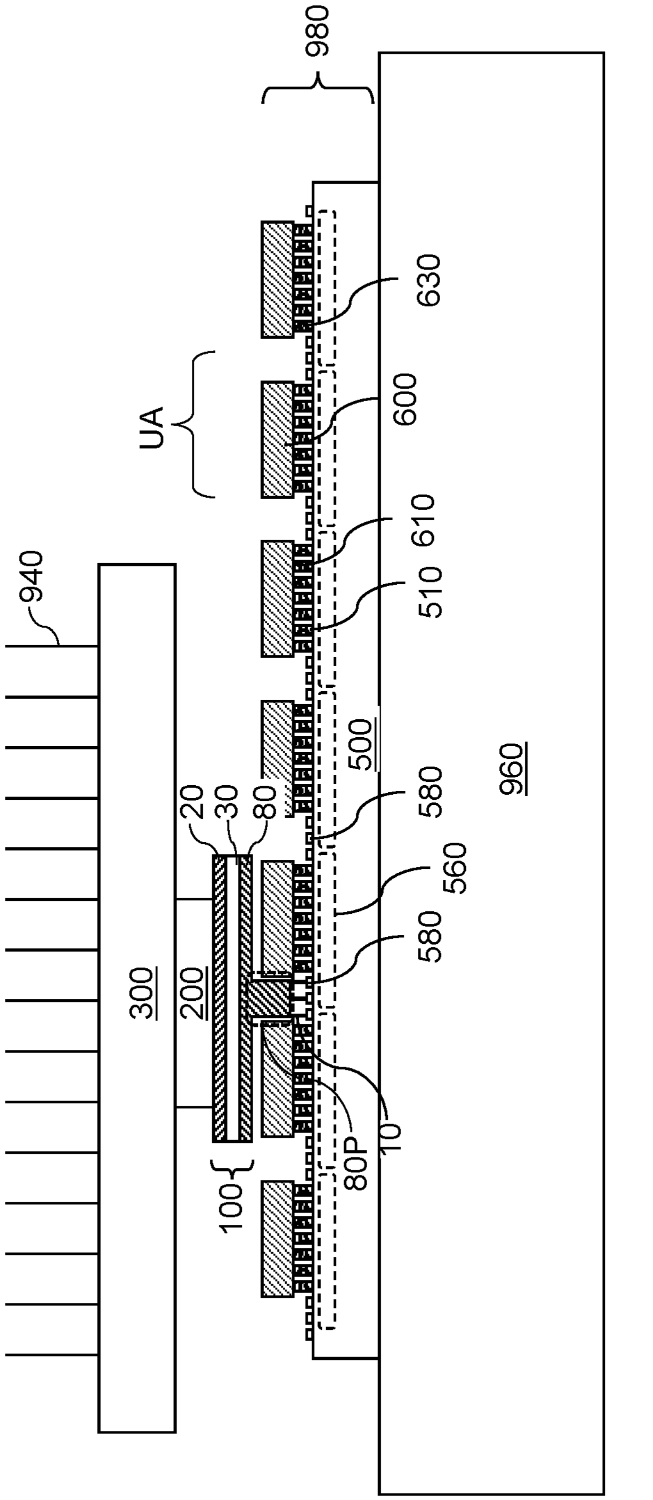
FIG. 5 is a vertical cross-sectional view of a portion of the test apparatus of FIG. 1 during testing of a semiconductor die using test pads on the wafer according to an embodiment of the present disclosure.

FIG. 5 is a vertical cross-sectional view of a portion of the test apparatus of FIG. 1 during testing of the assembly of the wafer 500 and the semiconductor dies 600 as a unit under testing (UUT) 980.

As discussed above, the lower guide plate 80 comprises a downward-protruding portion 80P having a first laterally-extending segment. The first laterally-extending segment may have a first width that is less than the lateral separation distance between a neighboring pair of semiconductor dies 600. For example, if semiconductor devices in a first semiconductor die 600 is to be tested after the semiconductor dies 600 are attached to the wafer 500, the first laterally-extending segment of the downward-protruding portion 80P of the lower guide plate 80 may be positioned in a gap between the first semiconductor die 600 and a second semiconductor die 600 which is a neighboring semiconductor die 600 of the first semiconductor die 600. As the plate assembly 100 is lowered, the first laterally-extending segment of the downward-protruding portion 80P of the lower guide plate 80 can be positioned below a horizontal plane including a top surface of the first semiconductor die 600, and remain in this position during testing of the functionality of the first semiconductor die 600.

The array of probes 10 may be manipulated (i.e., maneuvered and positioned) into contact with a subset of the test pads 580 located between the first semiconductor die 600 and the second semiconductor die 600 selected from the semiconductor dies 600 by lowering the plate assembly 100 toward the wafer. In some embodiments, manipulating the array of probes 10 may include moving the array of probes 10 in relation to a stationary wafer chuck 960 configured to hold a unit under testing (UUT) 980 thereupon. In other embodiments, manipulating the array of probes 10 may include moving the wafer chuck 960 configured to hold a unit under testing (UUT) 980 thereupon in relation to a stationary array of probes 10. The functionality of the first semiconductor die 600 by providing electrical signals to the first semiconductor die 600 through the subset of the test pads 580, through a subset of the interconnect structures (such as the redistribution interconnect structures 560) in an underlying interposer, through an array of wafer-side bonding pads 510, through an array of solder material portions 630, through an array of die-side bonding pads 610 of the first semiconductor die 600, and to devices within the first semiconductor die 600. Generally, the functionality of the first semiconductor die 600 can be tested by inducing contact between the array of probes 10 and a subset of the test pads 580 that is proximal to the first semiconductor die 600, and by providing electrical signals to devices within the first semiconductor die 600.

As discussed above, the lower guide plate 80 further comprises a base portion 80B that overlies the downward-protruding portion 80P and having a greater lateral extent than the downward-protruding portion 80P. Generally, the base portion 80B of the lower guide plate 80 may overlie the first semiconductor die 600 and the second semiconductor die 600, and may optionally overlie additional semiconductor dies 600, during the testing of the functionality of the first semiconductor die 600.

While the present disclosure has been described using an embodiment in which the array of probes 10 comprises a 3×10 rectangular array, it should be noted that the choice of a 3×10 rectangular array is arbitrary, and the array of probes 10 may be arranged in any other array configuration.

Figure 6A:
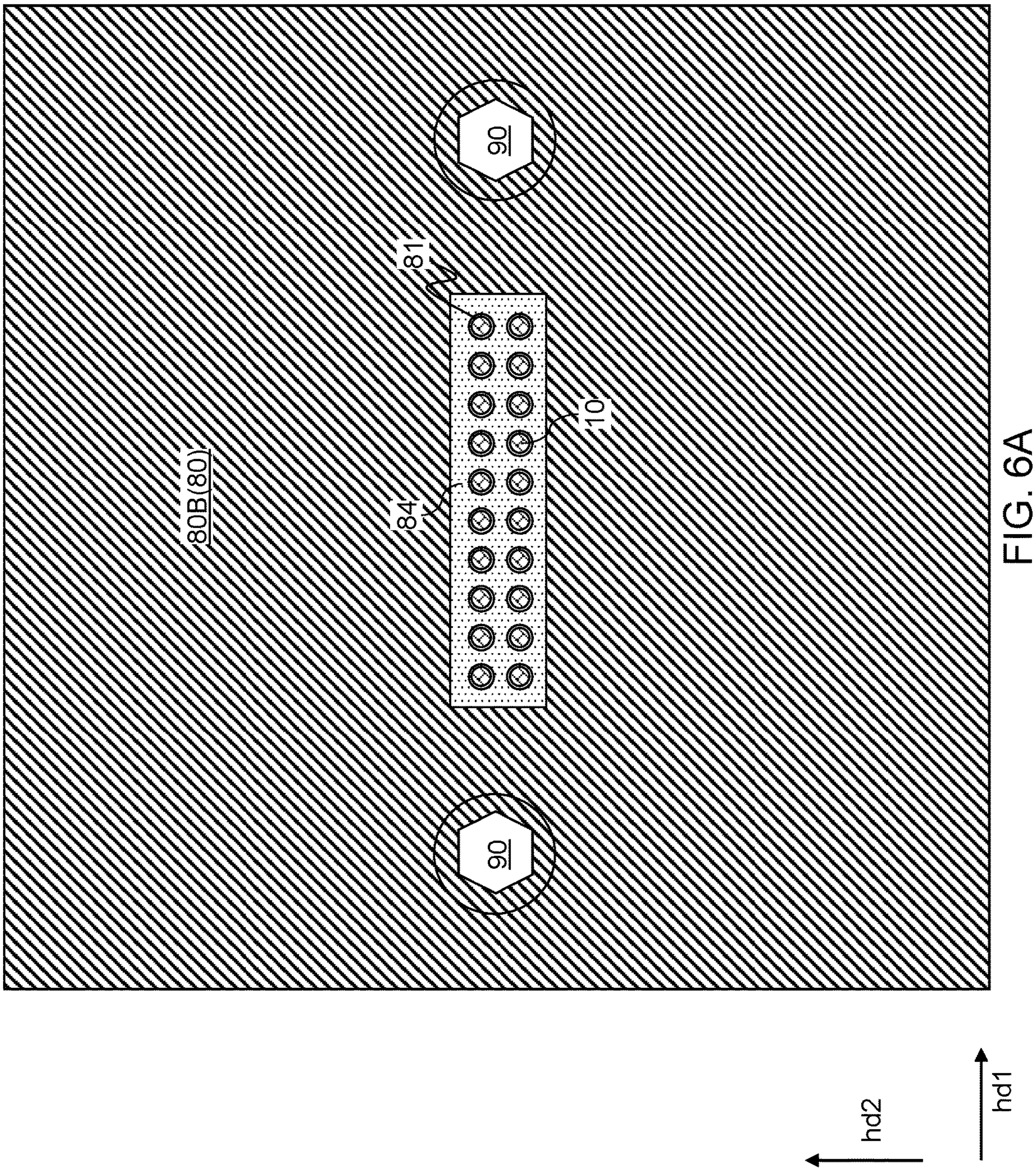
FIGS. 6A-6H are bottom-up views of various configurations of the probe assembly according to embodiments of the present disclosure.
Figure 6B:
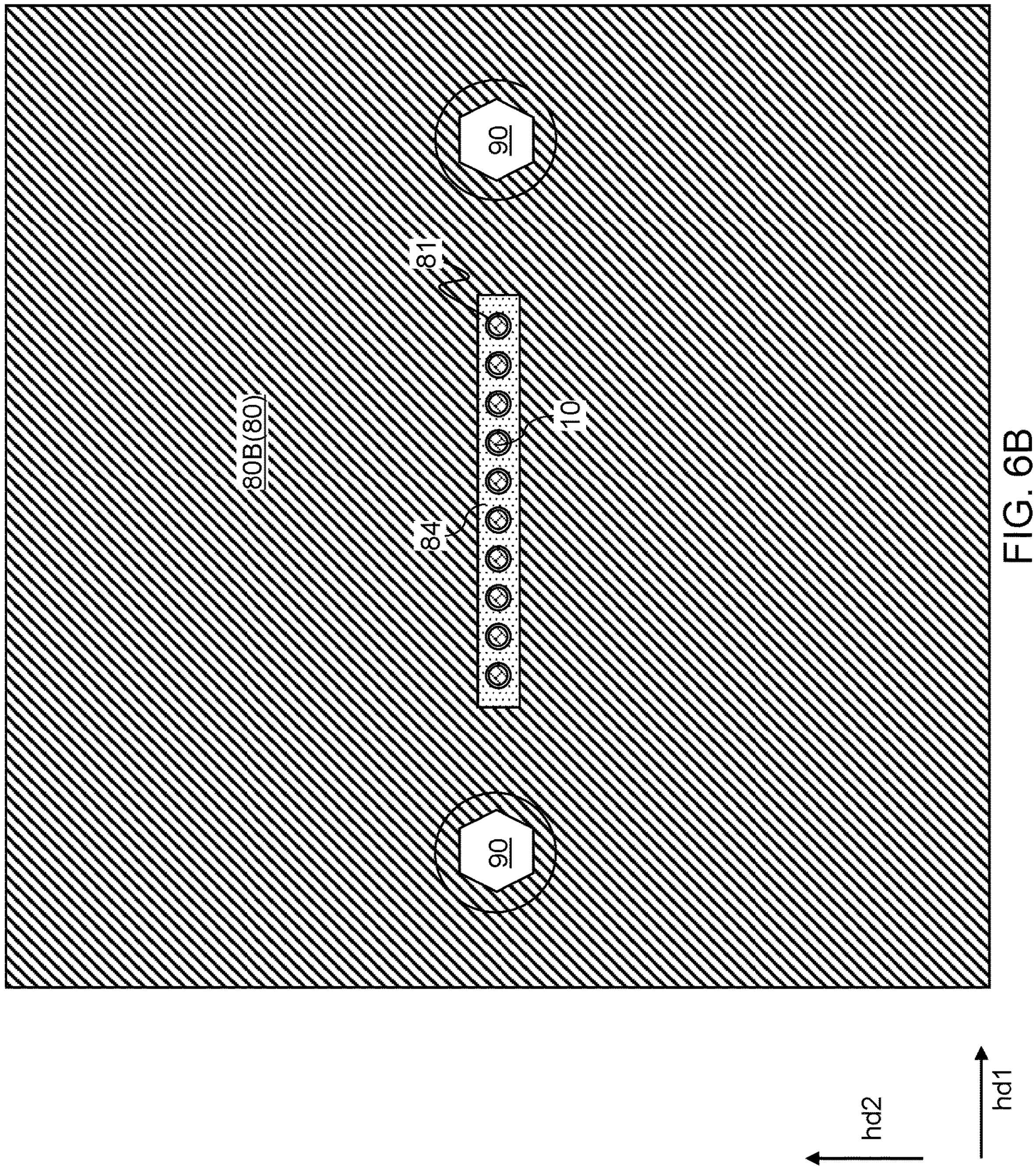
Figure 6C:
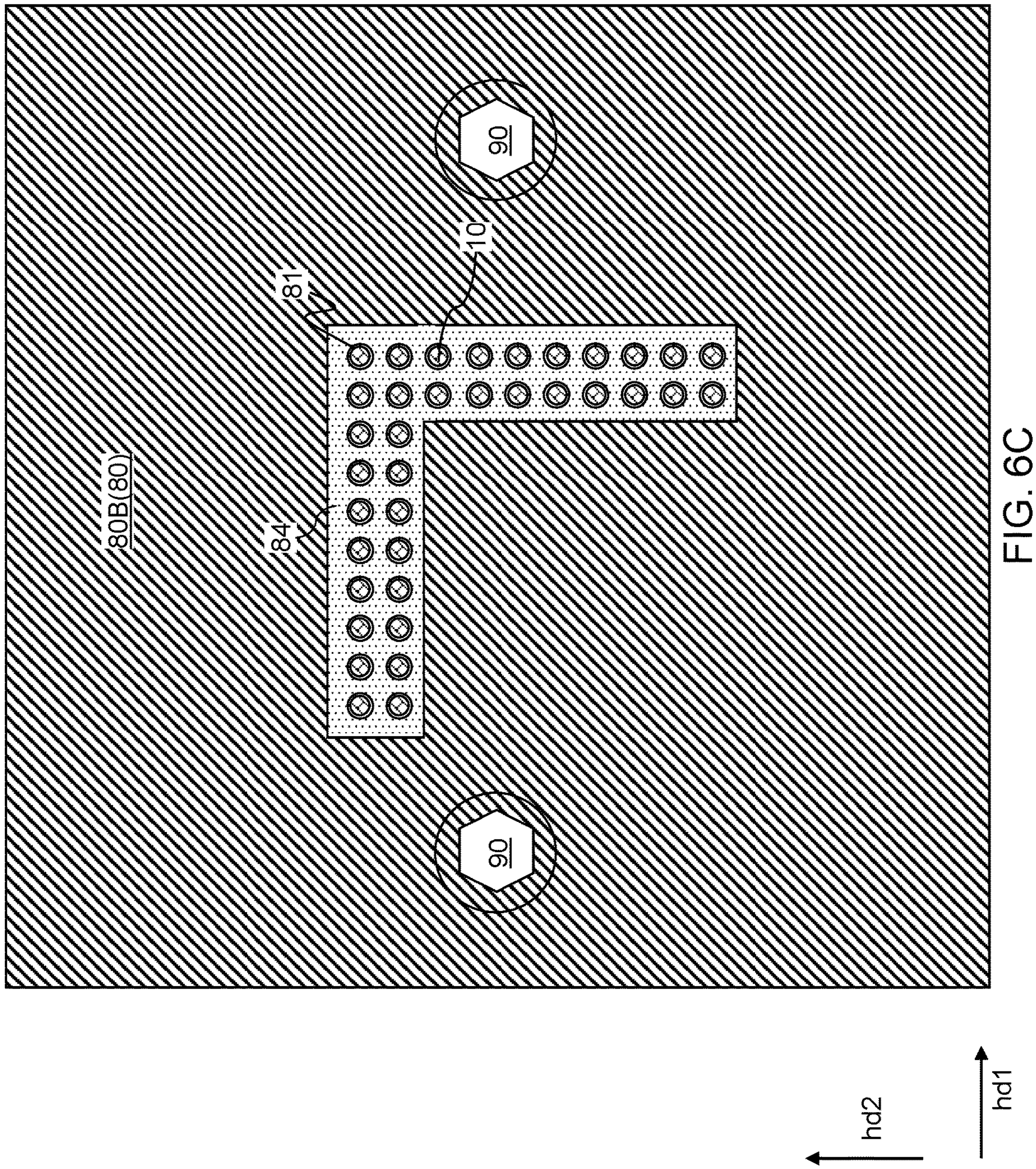
Figure 6D:
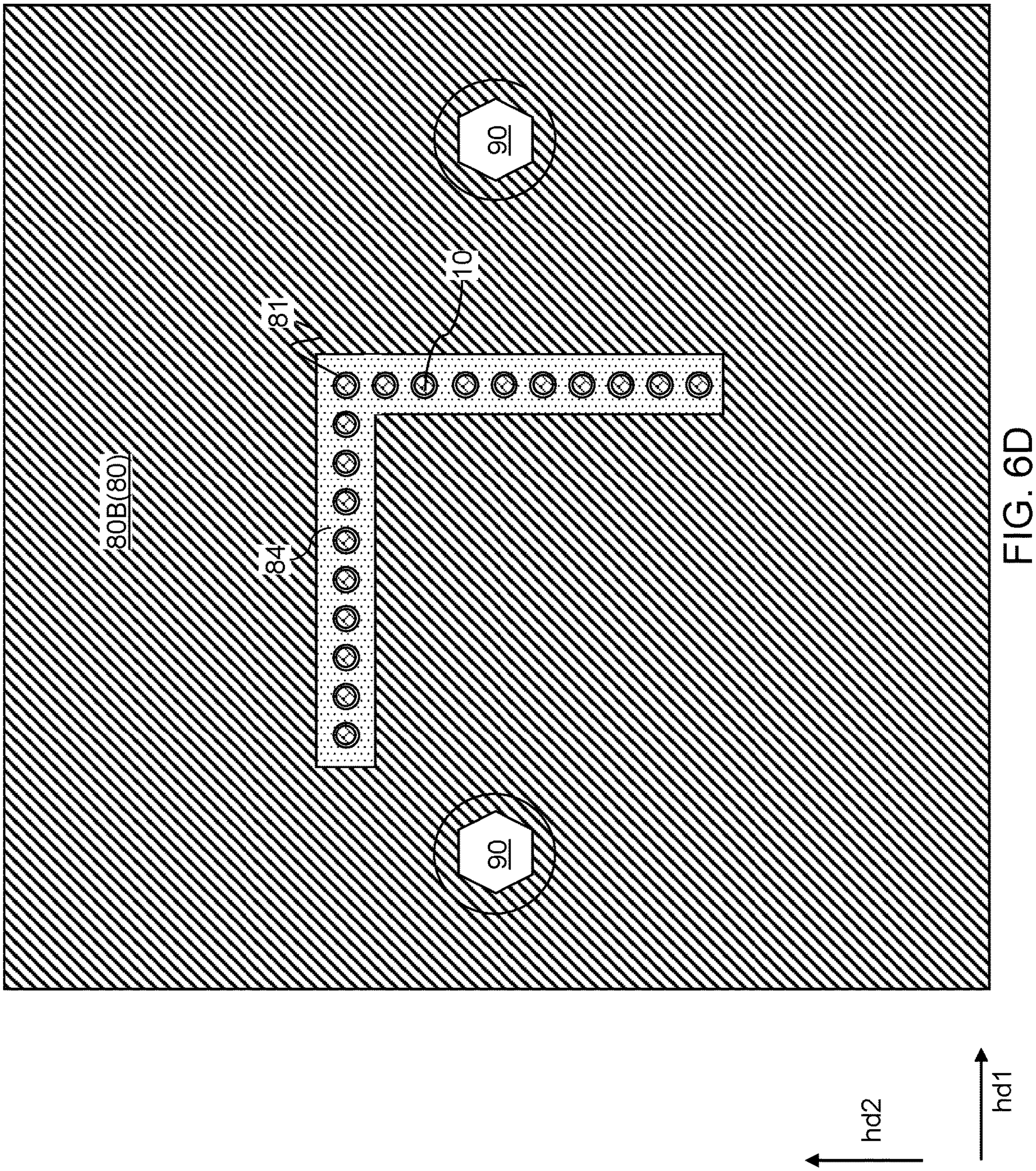
Figure 6E:
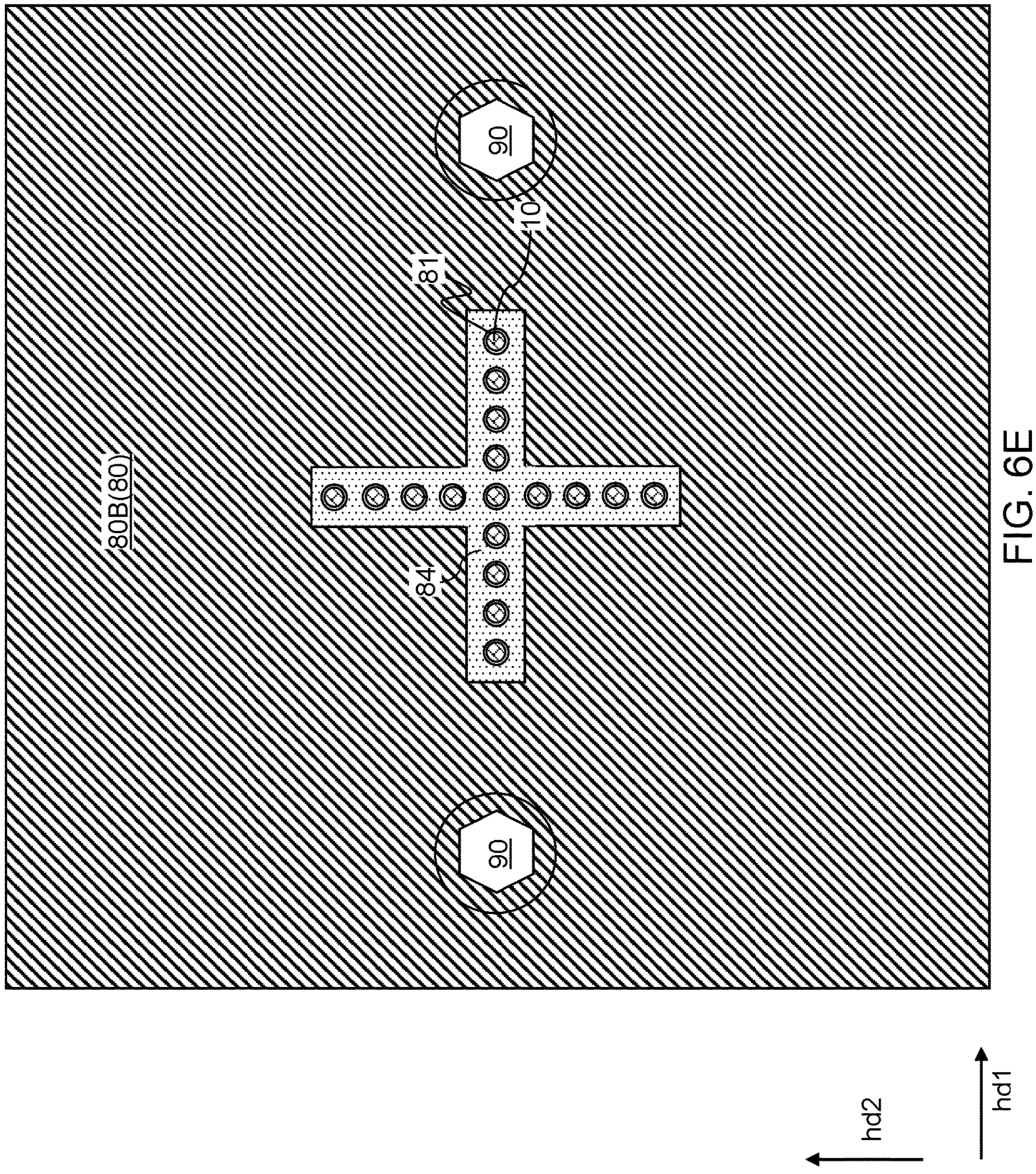
Figure 6F:
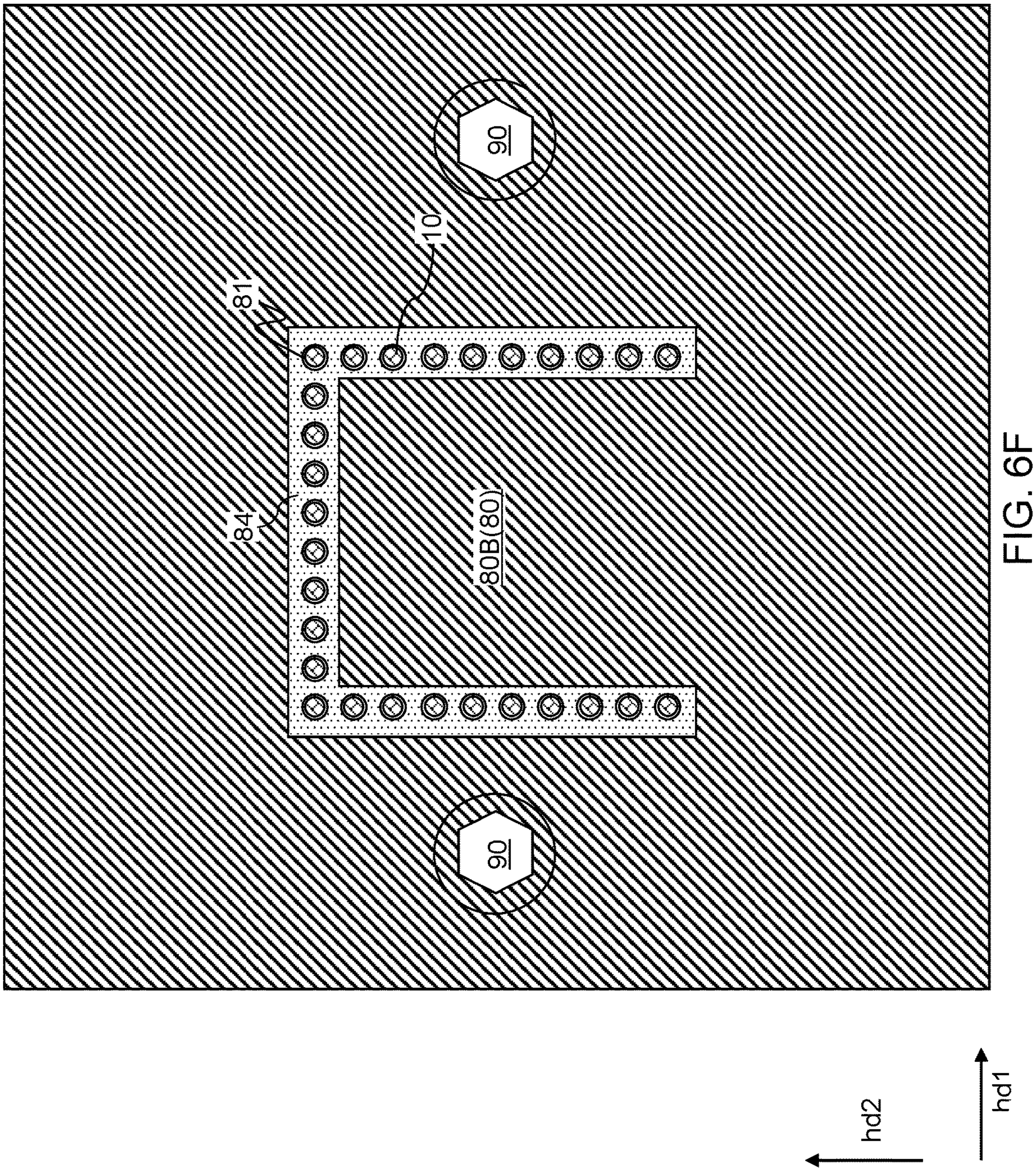
Figure 6G:
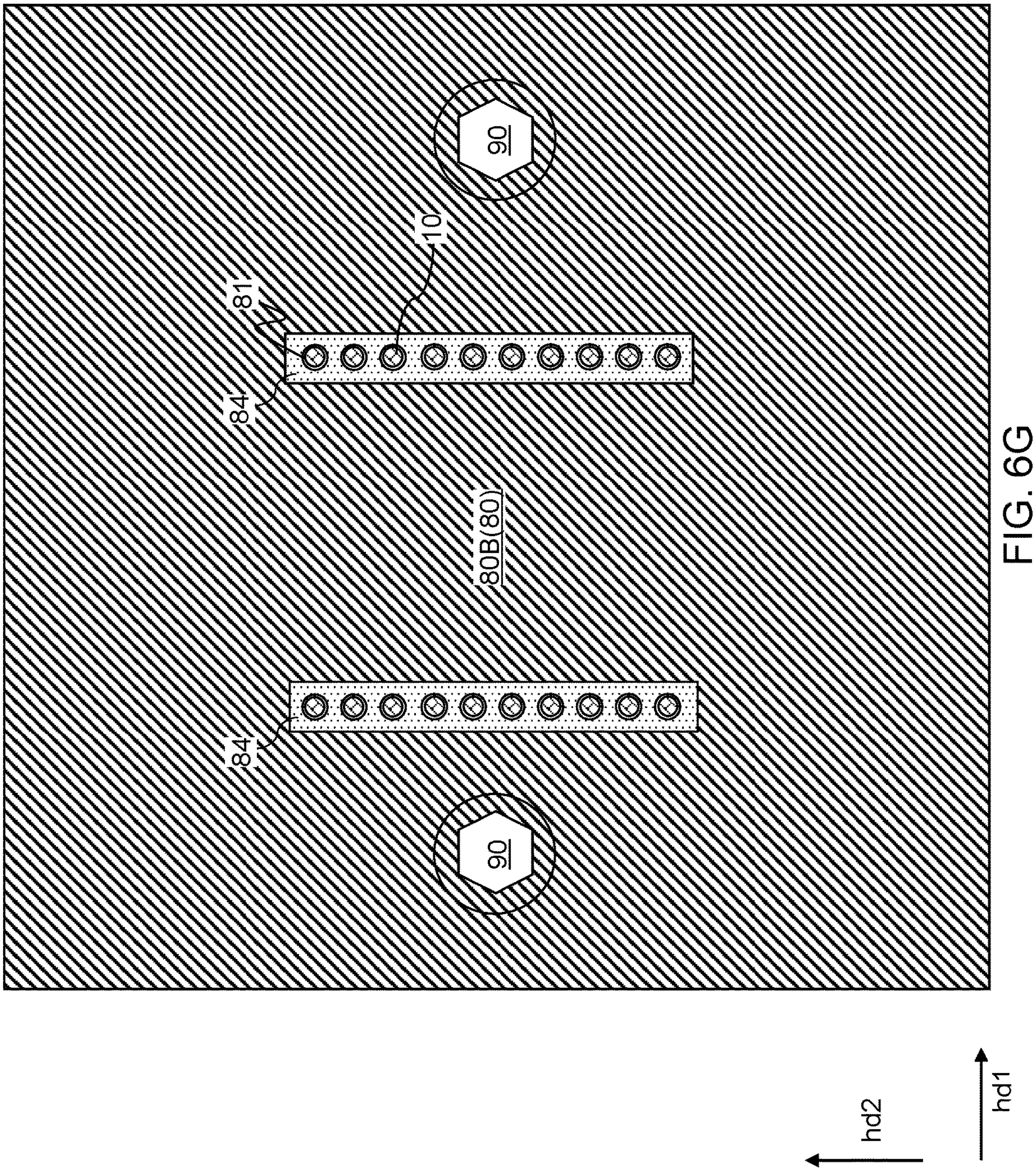
Figure 6H:
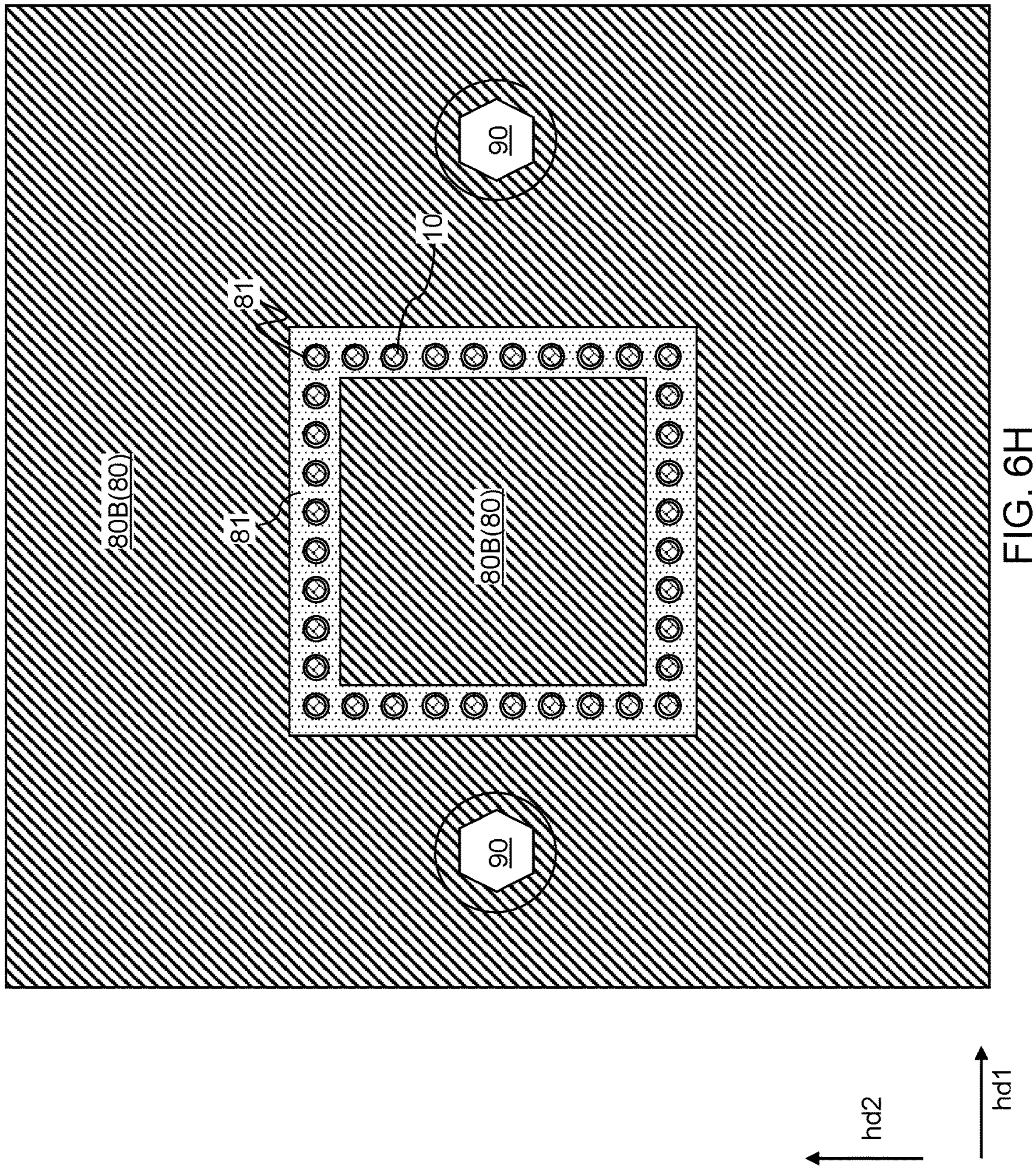

FIGS. 6A-6H are bottom-up views of various configurations of the probe assembly (10, 100, 200, 60) according to embodiments of the present disclosure. For example, the array of probes 10 may comprise a rectangular array of a different size than 3×10 (for example, as illustrated in FIG. 6A), a liner array including a single row of probes 10 (for example, as illustrated in FIG. 6B), an L-shaped array including at least one row of probes 10 and at least one column of probes adjoined at ends (for example, as illustrated in FIGS. 6C and 6D), a +-shaped (as referred to as a plus-shaped, cross-shaped) array including at least one row of probes 10 and at least one column of probes that intersect each other (for example, as illustrated in FIG. 6E), a U-shaped array including two sets of rows of probes 10 that are parallel to each other and laterally spaced from each other and further including at least one column of rows that connect the two sets of rows of probes 10 (for example, as illustrated in FIG. 6F), two or more rows of probes that are laterally spaced apart from each other or to one another (for example, as illustrated in FIG. 6G), or a frame-shaped array (for example, as illustrated in FIG. 6H). The various geometrical features of the pins 10 and the downward-protruding portion(s) 80P illustrated in FIGS. 6A-6H are not limiting or exhaustive in any way, and any configurations and shapes for the downward-protruding portion(s) 80P may be used provided that the downward-protruding portion(s) 80P can fit into a respective gap between a respective neighboring pair of semiconductor dies 600 below a horizontal plane including top surface of the semiconductor dies 600 during a testing step described with reference to FIG. 5.

In one embodiment, the lower guide plate 80 comprises at least one downward-protruding portion 80P that comprises a respective first laterally-extending segment that laterally extends along a first horizontal direction hd1 and having a respective first width along a second horizontal direction hd2. Each first width can be less than the gap between neighboring pairs of semiconductor dies 600, and may be in a range from 50 microns to 2 mm, such as from 100 microns to 1 mm, and/or from 200 microns to 500 microns, although lesser and greater dimensions may also be used. The at least one downward-protruding portion 80P may comprise a single downward-protruding portion 80P as illustrated in FIGS. 6A-6F and 6H, or may comprise a plurality of downward-protruding portions 80P as illustrated in FIG. 6G.

In one embodiment, a downward-protruding portion 80P may, or may not, comprise a second laterally-extending segment that laterally extend along a second horizontal direction hd2 that is perpendicular to the first horizontal direction hd1. For example, FIGS. 6C-6F and 6H illustrate embodiments in which the downward-protruding portion 80P comprises a second laterally-extending segment. In this embodiment, each second laterally-extending segment may be positioned between the first semiconductor die 600 and a third semiconductor die 600 during the testing of the functionality of the first semiconductor die 600.

In one embodiment, the first laterally-extending segment of the downward-protruding portion 80P laterally extends along a first horizontal direction hd1, and lower guide plate 80 comprises an additional downward-protruding portion 80P that laterally extends along the first horizontal direction hd1 as illustrated in FIG. 6G. In this embodiment, the additional downward-protruding portion 80P may be positioned between the first semiconductor die 600 and a third semiconductor die 600 during the testing of the functionality of the first semiconductor die 600.

Generally, various types of arrays of probes 10 may be used provided the pattern of the probes 10 within the array can fit within the areas of gaps between neighboring pairs of semiconductor dies within a unit under testing (UUT) comprises an assembly of a wafer 500 and semiconductor dies 600 as described above.

Figure 7:
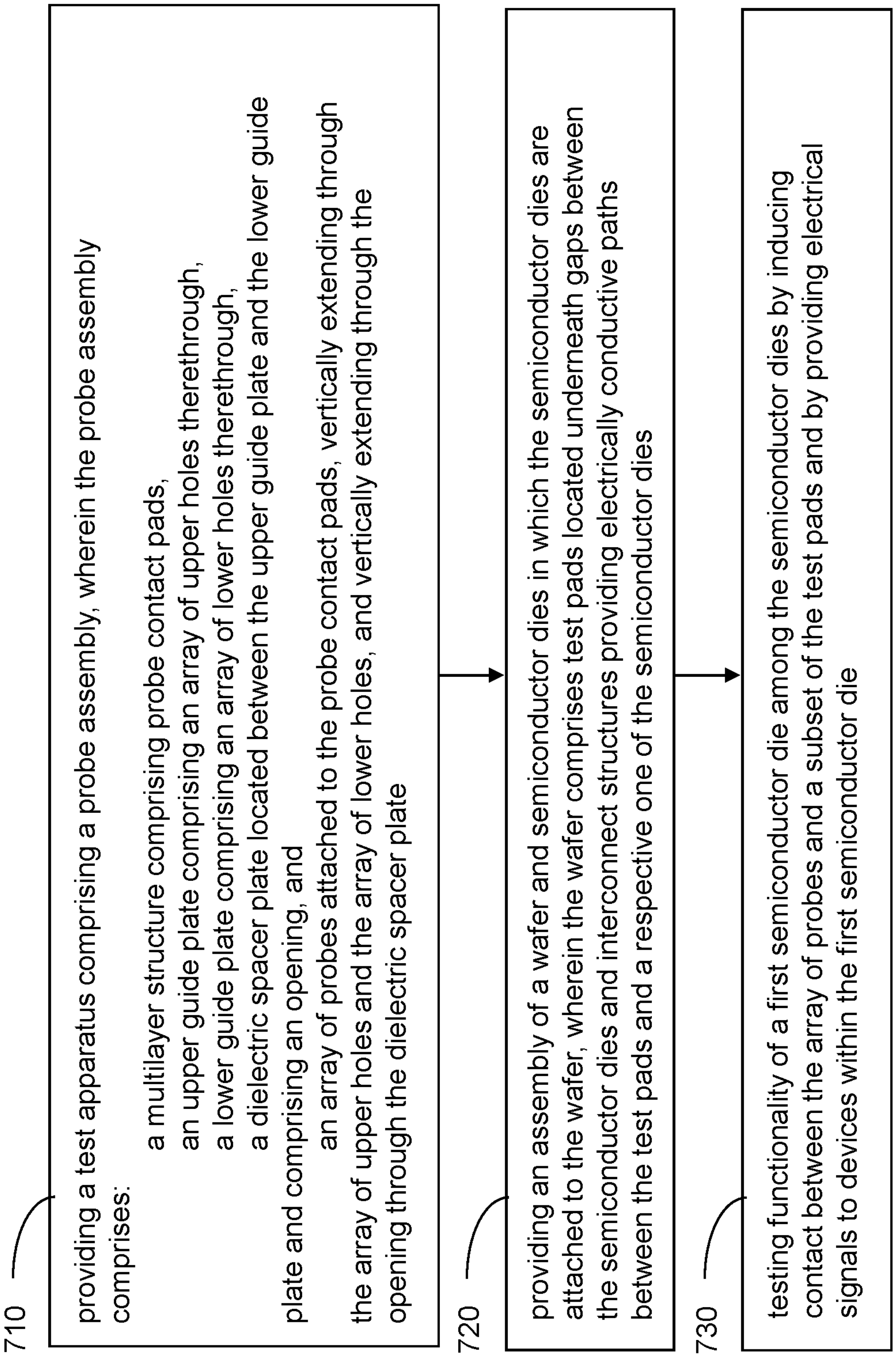
FIG. 7 is a first flowchart that illustrates the general processing steps for operating a test apparatus according to an aspect of the present disclosure.

Referring to FIG. 7, a first flowchart that illustrates the general processing steps for operating a test apparatus according to an aspect of the present disclosure.

Referring to step 710 and FIGS. 1, 2A-2E, and 6A-6G, a test apparatus comprising a probe assembly (10, 100, 200, 60) is provided. The probe assembly (10, 100, 200, 60) comprises: a multilayer structure 200 comprising probe contact pads 220, an upper guide plate 20 comprising an array of upper holes 21 therethrough, a lower guide plate 80 comprising an array of lower holes 81 therethrough, a dielectric spacer plate 30 located between the upper guide plate 20 and the lower guide plate 80 and comprising an opening 31, and an array of probes 10 attached to the probe contact pads 220, vertically extending through the array of upper holes 21 and the array of lower holes 81, and vertically extending through the opening 31 through the dielectric spacer plate 30.

Referring to step 720 and FIGS. 3A, 3B, and 4A-4C, an assembly of a wafer 500 and semiconductor dies 600 is provided, in which the semiconductor dies 600 are attached to the wafer 500. The wafer 500 comprises test pads 580 located underneath gaps between the semiconductor dies 600 and interconnect structures providing electrically conductive paths between the test pads 580 and a respective one of the semiconductor dies 600.

Referring to step 730 and FIG. 5, functionality of a first semiconductor die 600 selected from the semiconductor dies 600 can be tested by inducing contact between the array of probes 10 and a subset of the test pads 580 and by providing electrical signals to devices within the first semiconductor die 600.

In one embodiment, the lower guide plate 80 comprises a downward-protruding portion 80P having a first laterally-extending segment that is positioned in a gap between the first semiconductor die 600 and a second semiconductor die 600 below a horizontal plane including a top surface of the first semiconductor die 600 during said testing of the functionality of the first semiconductor die 600. In one embodiment, the lower guide plate 80 further comprises a base portion overlying the first semiconductor die 600 and the second semiconductor die 600 during said testing of the functionality of the first semiconductor die 600. In one embodiment, the downward-protruding portion 80P laterally extends along the second horizontal direction hd2 by a greater distance than a width of the gap.

In one embodiment, the test apparatus comprises a dielectric polymer layer 84 located on a bottom surface of the downward-protruding portion 80P and having an array of openings through which the array of probes 10 vertically extends. In one embodiment, the dielectric polymer layer 84 has a width that is less than a lateral dimension of the gap as measured between a sidewall of the first semiconductor die 600 that is exposed to the gap and a sidewall of the additional semiconductor die 600 that is exposed to the gap.

In one embodiment, the first laterally-extending segment of the downward-protruding portion 80P laterally extends along a first horizontal direction hd1; and the downward-protruding portion 80P comprises a second laterally-extending segment that laterally extend along a second horizontal direction hd2 that is perpendicular to the first horizontal direction hd1 and is positioned between the first semiconductor die 600 and a third semiconductor die 600 during said testing of the functionality of the first semiconductor die 600.

In one embodiment, the first laterally-extending segment of the downward-protruding portion 80P laterally extends along a first horizontal direction hd1; and the lower guide plate 80 comprises an additional downward-protruding portion 80P that laterally extends along the first horizontal direction hd1 and is positioned between the first semiconductor die 600 and a third semiconductor die 600 during said testing of the functionality of the first semiconductor die 600.

In one embodiment, the wafer 500 comprise wafer-side bonding pads 510; and the semiconductor dies 600 comprise die-side bonding pads 610 that are bonded to a respective subset of the wafer-side bonding pads 510. In one embodiment, the wafer-side bonding pads 510 have a same material composition as the test pads 580, and have a same thickness as the test pads 580. In one embodiment, the wafer 500 comprises a plurality of interposers; and the interconnect structures comprise redistribution interconnect structures 560 embedded within redistribution dielectric layers that are located in the wafer 500.

Figure 8:
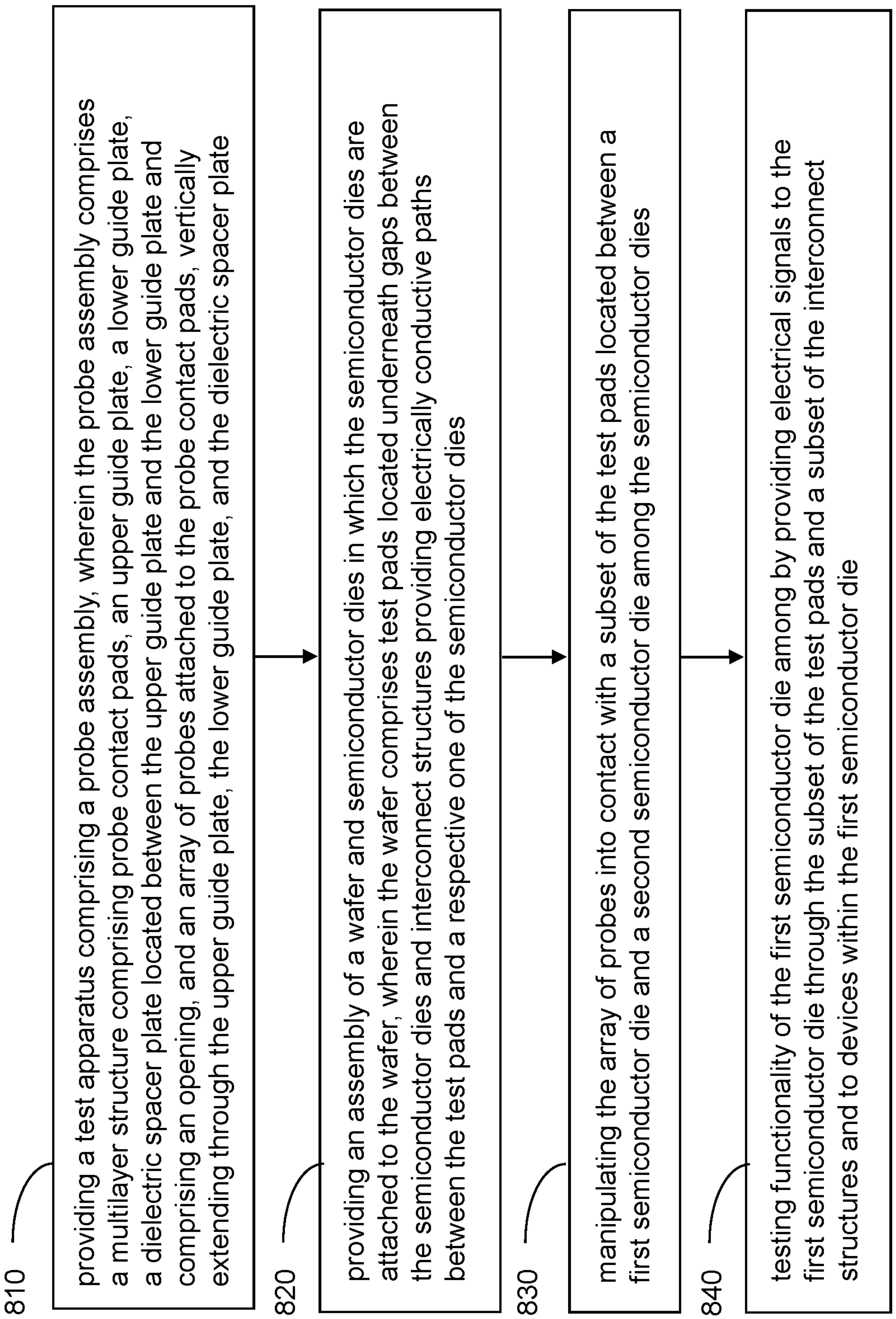
FIG. 8 is a second flowchart that illustrates the general processing steps for operating a test apparatus according to an aspect of the present disclosure.

Referring to FIG. 8, a second flowchart that illustrates the general processing steps for operating a test apparatus according to an aspect of the present disclosure Referring to step 810 and FIGS. 1, 2A-2E, and 6A-6G, a test apparatus comprising a probe assembly (10, 100, 200, 60) is provided. The probe assembly (10, 100, 200, 60) comprises a multilayer structure 200 comprising probe contact pads 220, an upper guide plate 20, a lower guide plate 80, a dielectric spacer plate 30 located between the upper guide plate 20 and the lower guide plate 80 and comprising an opening 31, and an array of probes 10 attached to the probe contact pads 220, vertically extending through the upper guide plate 20, the lower guide plate 80, and the dielectric spacer plate 30.

Referring step 820 and FIGS. 3A, 3B, and 4A-4C, an assembly of a wafer 500 and semiconductor dies 600 can be provided, in which the semiconductor dies 600 are attached to the wafer 500. The wafer 500 comprises test pads 580 located underneath gaps between the semiconductor dies 600 and interconnect structures providing electrically conductive paths between the test pads 580 and a respective one of the semiconductor dies 600.

Referring to step 830 and FIG. 5, the array of probes 10 may be manipulated into contact with a subset of the test pads 580 located between a first semiconductor die 600 and a second semiconductor die 600 selected from the semiconductor dies 600.

Referring to step 840 and FIG. 5, functionality of the first semiconductor die 600 can be tested by providing electrical signals to the first semiconductor die 600 through the subset of the test pads 580 and a subset of the interconnect structures and to devices within the first semiconductor die 600.

In one embodiment, the lower guide plate 80 comprises a downward-protruding portion 80P having a first laterally-extending segment that is positioned in a gap between the first semiconductor die 600 and a second semiconductor die 600 below a horizontal plane including a top surface of the first semiconductor die 600 during said testing of the functionality of the first semiconductor die 600. In one embodiment, the lower guide plate 80 further comprises a base portion overlying the first semiconductor die 600 and the second semiconductor die 600 during said testing of the functionality of the first semiconductor die 600.

In one embodiment, the wafer 500 comprise wafer-side bonding pads 510; and the semiconductor dies 600 comprise die-side bonding pads 610 that are bonded to a respective subset of the wafer-side bonding pads 510 through a respective set of solder material portions 630. In one embodiment, the wafer 500 comprises a plurality of interposers; and the interconnect structures comprise redistribution interconnect structures 560 embedded within redistribution dielectric layers that are located in the wafer 500 and comprising organic polymers.

Referring collectively to FIGS. 1-8, the various embodiments of the present disclosure can be used to provide a test apparatus in which probes 10 for contacting test pads 580 located between neighboring pairs of semiconductor dies 600 are laterally protected from neighboring structures by the downward-protruding portion 80P of the lower guide plate 80. The test apparatus of the present disclosure can be used to test functionality of semiconductor dies 600 after the semiconductor dies 600 are attached to a wafer 500, which may comprise, for example, interposers including redistribution interconnect structures 560 embedded within redistribution dielectric layers. The test apparatus of the present disclosure provide enhanced probe alignment for the purpose of making contact to, and performing tests using, test pads 580 disposed between neighboring pairs of semiconductor dies 600. The test pads 580 may have smaller sizes if the downward-protruding portion(s) 80P is/are used in the lower guide plate 80. Generally, the height h of each downward-protruding portion 80P may be selected such that the base portion 80B of the lower guide plate 80 does not contact any semiconductor die 600 during testing. Thus, the semiconductor dies 600 in a unit under testing (UUT) 980 and the probes 10 can be protected from physical damage during testing that is performed using the test apparatus of the present disclosure.

The foregoing outlines features of several embodiments so that those skilled in the art may better understand the aspects of the present disclosure. Each embodiment described using the term "comprises" also inherently discloses additional embodiments in which the term "comprises" is replaced with "consists essentially of" or with the term "consists of," unless expressly disclosed otherwise herein. Whenever two or more elements are listed as alternatives in a same paragraph of in different paragraphs, a Markush group including a listing of the two or more elements is also impliedly disclosed. Whenever the auxiliary verb "can" is used in this disclosure to describe formation of an element or performance of a processing step, an embodiment in which such an element or such a processing step is not performed is also expressly contemplated, provided that the resulting apparatus or device can provide an equivalent result. As such, the auxiliary verb "can" as applied to formation of an element or performance of a processing step should also be interpreted as "may" or as "may, or may not" whenever omission of formation of such an element or such a processing step is capable of providing the same result or equivalent results, the equivalent results including somewhat superior results and somewhat inferior results. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of operating a test apparatus, the method comprising:

providing a test apparatus comprising a probe assembly, wherein the probe assembly comprises:

a multilayer structure comprising probe contact pads;

an upper guide plate comprising an array of upper holes therethrough;

a lower guide plate comprising an array of lower holes therethrough;

a dielectric spacer plate located between the upper guide plate and the lower guide plate and comprising an opening; and an array of probes attached to the probe contact pads, vertically extending through the array of upper holes and the array of lower holes, and vertically extending through the opening through the dielectric spacer plate;

providing an assembly of a wafer and semiconductor dies in which the semiconductor dies are attached to the wafer, wherein the wafer comprises test pads located underneath gaps between the semiconductor dies and further comprises interconnect structures providing electrically conductive paths between the test pads and a respective one of the semiconductor dies; and testing functionality of a first semiconductor die selected from the semiconductor dies by inducing contact between the array of probes and a subset of the test pads and by providing electrical signals to devices within the first semiconductor die, wherein the lower guide plate comprises a downward-protruding portion having a segment that laterally extends along a first horizontal direction and is positioned in a gap between the first semiconductor die and a second semiconductor die below a horizontal plane including a top surface of the first semiconductor die during said testing of the functionality of the first semiconductor die.

2. The method of claim 1, wherein the lower guide plate further comprises a base portion overlying the first semiconductor die and the second semiconductor die during said testing of the functionality of the first semiconductor die.

3. The method of claim 1, wherein the downward-protruding portion laterally extends along a second horizontal direction by a greater distance than a width of the gap.

4. The method of claim 1, wherein the test apparatus comprises a dielectric polymer layer located on a bottom surface of the downward-protruding portion and having an array of openings through which the array of probes vertically extends.

5. The method of claim 4, wherein the dielectric polymer layer has a width that is less than a lateral dimension of the gap as measured between a sidewall of the first semiconductor die that is exposed to the gap and a sidewall of an additional semiconductor die that is exposed to the gap.

6. The method of claim 1, wherein:

the downward-protruding portion comprises a second laterally-extending segment that laterally extends along the second horizontal direction that is perpendicular to the first horizontal direction and is positioned between the first semiconductor die and a third semiconductor die during said testing of the functionality of the first semiconductor die.

7. The method of claim 1, wherein:

the lower guide plate comprises an additional downward-protruding portion that laterally extends along the first horizontal direction and is positioned between the first semiconductor die and a third semiconductor die during said testing of the functionality of the first semiconductor die.

8. The method of claim 1, wherein:

the wafer comprises wafer-side bonding pads; and the semiconductor dies comprise die-side bonding pads that are bonded to a respective subset of the wafer-side bonding pads.

9. The method of claim 8, wherein the wafer-side bonding pads have a same material composition as the test pads, and have a same thickness as the test pads.

10. The method of claim 1, wherein:

the wafer comprises a plurality of interposers; and the interconnect structures comprise redistribution interconnect structures embedded within redistribution dielectric layers that are located in the wafer.

11. A method of operating a test apparatus, the method comprising:

providing a test apparatus comprising a probe assembly, wherein the probe assembly comprises a multilayer structure comprising probe contact pads, an upper guide plate, a lower guide plate, a dielectric spacer plate located between the upper guide plate and the lower guide plate and comprising an opening, and an array of probes attached to the probe contact pads, vertically extending through the upper guide plate, the lower guide plate, and the dielectric spacer plate;

providing an assembly of a wafer and semiconductor dies in which the semiconductor dies are attached to the wafer, wherein the wafer comprises test pads located underneath gaps between the semiconductor dies and further comprises interconnect structures providing electrically conductive paths between the test pads and a respective one of the semiconductor dies;

manipulating the array of probes into contact with a subset of the test pads located between a first semiconductor die and a second semiconductor die selected from the semiconductor dies; and testing functionality of the first semiconductor die by providing electrical signals to the first semiconductor die through the subset of the test pads and a subset of the interconnect structures and to devices within the first semiconductor die, wherein the lower guide plate comprises a downward-protruding portion having a first laterally-extending segment that is positioned in a gap between the first semiconductor die and a second semiconductor die below a horizontal plane including a top surface of the first semiconductor die during said testing of the functionality of the first semiconductor die.

12. The method of claim 11, wherein the lower guide plate further comprises a base portion overlying the first semiconductor die and the second semiconductor die during said testing of the functionality of the first semiconductor die.

13. The method of claim 11, wherein:

the wafer comprises wafer-side bonding pads; and the semiconductor dies comprise die-side bonding pads that are bonded to a respective subset of the wafer-side bonding pads through a respective set of solder material portions.

14. The method of claim 11, wherein:

the wafer comprises a plurality of interposers; and the interconnect structures comprise redistribution interconnect structures embedded within redistribution dielectric layers that are located in the wafer and comprising organic polymers.

15. A structure comprising a probe assembly, the probe assembly comprising:

a multilayer structure comprising probe contact pads;

an upper guide plate comprising an array of upper holes therethrough;

a lower guide plate comprising an array of lower holes therethrough;

a dielectric spacer plate located between the upper guide plate and the lower guide plate and comprising an opening; and an array of probes attached to the probe contact pads, vertically extending through the array of upper holes and the array of lower holes, and vertically extending through the opening through the dielectric spacer plate, wherein the lower guide plate comprises a downward-protruding portion having a first laterally-extending segment having a first width and extending along a first horizontal direction, and a second laterally-extending segment extending along a second horizontal direction perpendicular to the first horizontal direction, wherein the first laterally-extending segment and the second laterally-extending segment intersect, and further comprises a base portion overlying the downward-protruding portion and having a second width that is larger than the first width, wherein the downward-protruding portion has a geometry adapted to extend into a gap between a first semiconductor die and a second semiconductor die below a horizontal plane including a top surface of the first semiconductor die during testing of functionality of the first semiconductor die, and the base portion has a geometry adapted to overlie the first semiconductor die and the second semiconductor die during testing of functionality of the first semiconductor die.

16. The structure of claim 15, wherein the second width is at least 5 times the first width and wherein the first laterally-extending segment has a first length that is at least 5 times the first width.

17. The structure of claim 15, wherein:

the first laterally-extending segment of the downward-protruding portion laterally extends along a first horizontal direction; and the downward-protruding portion comprises a second laterally-extending segment that laterally extend along a second horizontal direction that is perpendicular to the first horizontal direction.

18. The structure of claim 15, wherein:

the first laterally-extending segment of the downward-protruding portion laterally extends along a first horizontal direction; and the lower guide plate comprises an additional downward-protruding portion that laterally extends along the first horizontal direction and is laterally spaced from the first downward-protruding portion by a spacing that is at least 5 times the first width.

19. The structure of claim 15, wherein the downward-protruding portion laterally extends along a second horizontal direction by a greater distance than a width of a gap between semiconductor dies.

20. The structure of claim 15, further comprising a dielectric polymer layer located on a bottom surface of the downward-protruding portion and having an array of openings through which the array of probes vertically extends, wherein the dielectric polymer layer has a width that is less than a lateral dimension of the gap.

* * * * *